(12) United States Patent
Yoshihara

(10) Patent No.: US 11,955,440 B2
(45) Date of Patent: Apr. 9, 2024

(54) SEMICONDUCTOR DEVICE WITH DETECTION CONDUCTOR

(71) Applicant: ROHM CO., LTD., Kyoto (JP)

(72) Inventor: Katsuhiko Yoshihara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 394 days.

(21) Appl. No.: 17/273,532

(22) PCT Filed: Sep. 10, 2019

(86) PCT No.: PCT/JP2019/035459
§ 371 (c)(1),
(2) Date: Mar. 4, 2021

(87) PCT Pub. No.: WO2020/054688
PCT Pub. Date: Mar. 19, 2020

(65) Prior Publication Data
US 2021/0193592 A1    Jun. 24, 2021

(30) Foreign Application Priority Data

Sep. 12, 2018 (JP) ................................. 2018-170502

(51) Int. Cl.
H01L 23/00 (2006.01)
H01L 23/495 (2006.01)
H01L 23/532 (2006.01)

(52) U.S. Cl.
CPC ...... *H01L 23/562* (2013.01); *H01L 23/49562* (2013.01); *H01L 23/53209* (2013.01); *H01L 24/06* (2013.01); *H01L 2224/49433* (2013.01)

(58) Field of Classification Search
CPC ......... H01L 25/18; H01L 24/05; H01L 24/37; H01L 24/41; H01L 24/49; H01L 24/84;
(Continued)

(56) References Cited

U.S. PATENT DOCUMENTS

| 9,343,388 B2* | 5/2016 | Terai .................. H01L 23/3135 |
| 2019/0295990 A1 | 9/2019 | Hayashi et al. |
| 2020/0266134 A1 | 8/2020 | Kanda et al. |

FOREIGN PATENT DOCUMENTS

| JP | 6-21323 A | 1/1994 |
| JP | 2008-294384 A | 12/2008 |

(Continued)

OTHER PUBLICATIONS

International Search Report issued in PCT/JP2019/035459, dated Dec. 3, 2019 (2 pages).

(Continued)

*Primary Examiner* — Tan N Tran
(74) *Attorney, Agent, or Firm* — Hamre, Schumann, Mueller & Larson, P.C.

(57) ABSTRACT

A semiconductor device includes an insulating support member, a first and a second conductive layer, a first semiconductor element, a first lead, a first detection conductor and a first gate conductor. The first and second conductive layers are disposed on a front surface of the insulating support member. The first semiconductor includes a first and a second electrode on the same side, and a third electrode disposed on the other side and electrically connected to the first conductive layer. The first lead is connected to the first and second conductive layer. The first detection conductor is connected to the first electrode. The first gate conductor is connected to the second electrode. At least one of the first detection conductor and the first gate conductor has an end connected to the first semiconductor element. The end has a coefficient of linear expansion smaller than that of the first conductive layer.

16 Claims, 35 Drawing Sheets

(58) Field of Classification Search
CPC . H01L 24/06; H01L 23/53209; H01L 25/072; H01L 23/49562; H01L 23/562; H01L 24/40; H01L 2224/37013; H01L 2224/37147; H01L 24/45; H01L 2224/04042; H01L 2224/92247; H01L 24/73; H01L 2224/45124; H01L 2224/73265; H01L 2224/29111; H01L 24/29; H01L 2224/0603; H01L 2224/4554; H01L 2224/49175; H01L 2224/41174; H01L 2224/45147; H01L 2224/48463; H01L 24/85; H01L 2224/84411; H01L 2224/48091; H01L 2224/73221; H01L 2924/181; H01L 2224/05599; H01L 2224/49113; H01L 2224/49433; H01L 2224/40; H01L 2224/04034; H01L 2224/376; H01L 2224/48499; H01L 2224/83801; H01L 24/83; H01L 2924/19107; H01L 2224/84801; H01L 2224/37033; H01L 2224/06181; H01L 2224/40499; H01L 24/92; H01L 2924/00012; H01L 2924/00014; H01L 2924/013; H01L 2924/01403; H01L 2924/01047; H01L 2924/014; H01L 2924/01013; H01L 2924/0105; H01L 2924/01029; H01L 2924/01402; H01L 2924/01026; H01L 2924/01028; H01L 2924/01027; H01L /
USPC .......................................................... 257/676
See application file for complete search history.

(56) References Cited

FOREIGN PATENT DOCUMENTS

| JP | 2011-254387 A | | 12/2011 | |
|----|---------------|---|---------|---|
| JP | 2017-107937 A | | 6/2017 | |
| JP | 2017107937 A | * | 6/2017 | ... H01L 2224/49431 |
| WO | 2017-209191 A1 | | 12/2017 | |
| WO | 2017209191 A1 | * | 12/2017 | ............. H01L 25/18 |
| WO | 2018/043535 A1 | | 3/2018 | |
| WO | 2018043535 A1 | * | 3/2018 | .......... H01L 1123/36 |
| WO | 2019/098368 A1 | | 5/2019 | |

OTHER PUBLICATIONS

Office Action received in the corresponding Japanese Patent application, dated Feb. 14, 2023 and English translation (8 pages).

\* cited by examiner

SEMICONDUCTOR DEVICE WITH DETECTION CONDUCTOR

TECHNICAL FIELD

The present disclosure relates to a semiconductor device provided with a semiconductor element, and more specifically, to a semiconductor device provided with a switching element as the semiconductor element.

BACKGROUND ART

Semiconductor devices with switching elements such as MOSFETs or IGBTs are conventionally known. An example of a semiconductor device that uses a MOSFET is disclosed in Patent Document 1. In the semiconductor device, a semiconductor element is bonded to a lead that constitutes a drain terminal. The semiconductor device has a metal piece connected to a source pad of the semiconductor element and to a lead that constitutes a source terminal. The metal piece, which is made of aluminum, allows for flowing a large amount of current through the semiconductor element. The metal piece also promotes heat dissipation from the semiconductor element, thereby reducing ON-resistance.

The inventor conducted a $\Delta T_j$ power cycle test to a device having a configuration similar to the semiconductor device disclosed in Patent Document 1, to find that cracking can occur in the bonding layer (such as solder) interposed between the source pad and the metal piece. This is due to the thermal stress generated because the coefficient of linear expansion of the metal piece is large as compared with the semiconductor element. Such cracking in the bonding layer can be prevented by changing the material for the metal piece to copper (of which coefficient of linear expansion is smaller than that of aluminum). However, conducting a $\Delta T_j$ power cycle test to such a configuration using copper revealed that the gate wire connected to the gate pad of the semiconductor element and a sense wire connected to the source pad can be detached from the semiconductor element due to the concentration of thermal stress.

TECHNICAL REFERENCE

Patent Document

Patent Document 1: JP-A-2008-294384

SUMMARY OF THE INVENTION

Problems to be Solved by the Invention

An object of the present disclosure is to provide a semiconductor device that reduces or eliminates the problems described above (cracking of a bonding layer or detachment of a wire) and provides a high reliability.

Means for Solving the Problems

The semiconductor device provided according to an aspect of the present disclosure includes: an insulating support member having a front surface; a first and a second conductive layer disposed on the front surface; a first semiconductor element having a first side facing the front surface and a second side facing away from the first side in a thickness direction of the insulating support member, where the first semiconductor element is provided with a first and a second electrode on the second side and a third electrode on the first side, and the third electrode is bonded for electrical connection to the first conductive layer; a first lead connected to the first electrode and the second conductive layer; a first detection conductor connected to the first electrode; and a first gate conductor connected to the second electrode. At least one of the first detection conductor and the first gate conductor has an end connected to the first semiconductor element, where the end has a coefficient of linear expansion smaller than a coefficient of linear expansion of the first conductive layer.

Preferably, each of the first detection conductor and the first gate conductor has a pillow part connected to the first semiconductor element and a wire part connected to the pillow part, and the pillow part has a coefficient of linear expansion smaller than the coefficient of linear expansion of the first conductive layer.

Preferably, the pillow part comprises: a first layer made of an alloy containing iron and nickel; and a pair of second layers made of a metal different from the first layer, and the first layer is disposed between the paired second layers in the thickness direction.

Preferably, the pillow part comprises a first layer made of a semiconductor material and a pair of second layers made of a metal, and the first layer is disposed between the paired second layers in the thickness direction.

Preferably, the first detection conductor comprises a metal piece, the first gate conductor comprises a pillow part connected to the first semiconductor element and a wire part connected to the pillow part, and each of the first detection conductor and the pillow part has a coefficient of linear expansion smaller than the coefficient of linear expansion of the first conductive layer.

Preferably, the first detection conductor comprises: a first layer made of an alloy containing iron and nickel; and a pair of second layers made of a metal different from the first layer, and the first layer is disposed between the paired second layers in the thickness direction.

Preferably, each of the first detection conductor and the first gate conductor comprises a metal piece, and each of the first detection conductor and the first gate conductor has a coefficient of linear expansion smaller than the coefficient of linear expansion of the first conductive layer.

Preferably, the semiconductor device further comprises a first detection wiring layer to which the first detection conductor is connected and a first gate wiring layer to which the first gate conductor is connected, where the first detection wiring layer and the first gate wiring layer overlap with the front surface as viewed along the thickness direction.

Preferably, the first detection wiring layer and the first gate wiring layer are disposed on the front surface.

Preferably, the semiconductor device further comprises an insulating layer disposed on the first conductive layer, wherein the first detection wiring layer and the first gate wiring layer are disposed on the insulating layer.

Preferably, the semiconductor device further comprises: a second semiconductor element provided with a first electrode, a second electrode and a third electrode, where the third electrode is bonded for electrical connection to the second conductive layer; a second lead connected to the first electrode of the second semiconductor element; a second detection conductor connected to the first electrode of the second semiconductor element; and a second gate conductor connected to the second electrode of the second semiconductor element. At least one of the second detection conductor and the second gate conductor has an end connected to the second semiconductor element, and the end has a coefficient of linear expansion smaller than a coefficient of linear expansion of the second conductive layer.

Preferably, each of the second detection conductor and the second gate conductor comprises a pillow part connected to the second semiconductor element and a wire part connected to the pillow part, and the pillow part has a coefficient of linear expansion smaller than the coefficient of linear expansion of the second conductive layer.

Preferably, the second detection conductor comprises a metal piece, the second gate conductor comprises a pillow part connected to the second semiconductor element and a wire part connected to the pillow part, and each of the second detection conductor and the pillow part has a coefficient of linear expansion smaller than the coefficient of linear expansion of the second conductive layer.

Preferably, each of the second detection conductor and the second gate conductor comprises a metal piece, and each of the second detection conductor and the second gate conductor has a coefficient of linear expansion smaller than the coefficient of linear expansion of the second conductive layer.

Preferably, the semiconductor device further comprises: a second detection wiring layer to which the second detection conductor is connected; and a second gate wiring layer to which the second gate conductor is connected, where the second detection wiring layer and the second gate wiring layer overlap with the front surface as viewed along the thickness direction.

Preferably, the semiconductor device further comprises: a first input terminal electrically connected to the first conductive layer; a second input terminal electrically connected to the second lead; and an output terminal electrically connected to the second conductive layer, where each of the first input terminal and the second input terminal is spaced apart from the output terminal in a direction orthogonal to the thickness direction, and the second lead is connected to the second input terminal.

Preferably, the first input terminal and the second input terminal are spaced apart from each other in the thickness direction, and a part of the second input terminal overlaps with the first input terminal as viewed along the thickness direction.

Other features and advantages of the semiconductor device according to the present disclosure will become apparent from the detailed description given below with reference to the accompanying drawings.

MODE FOR CARRYING OUT THE INVENTION

Various embodiments and their variations according to the present disclosure are described below based on the drawings.

First Embodiment

A semiconductor device A10 according to a first embodiment is described below based on FIGS. 1-16.

Figure 3:
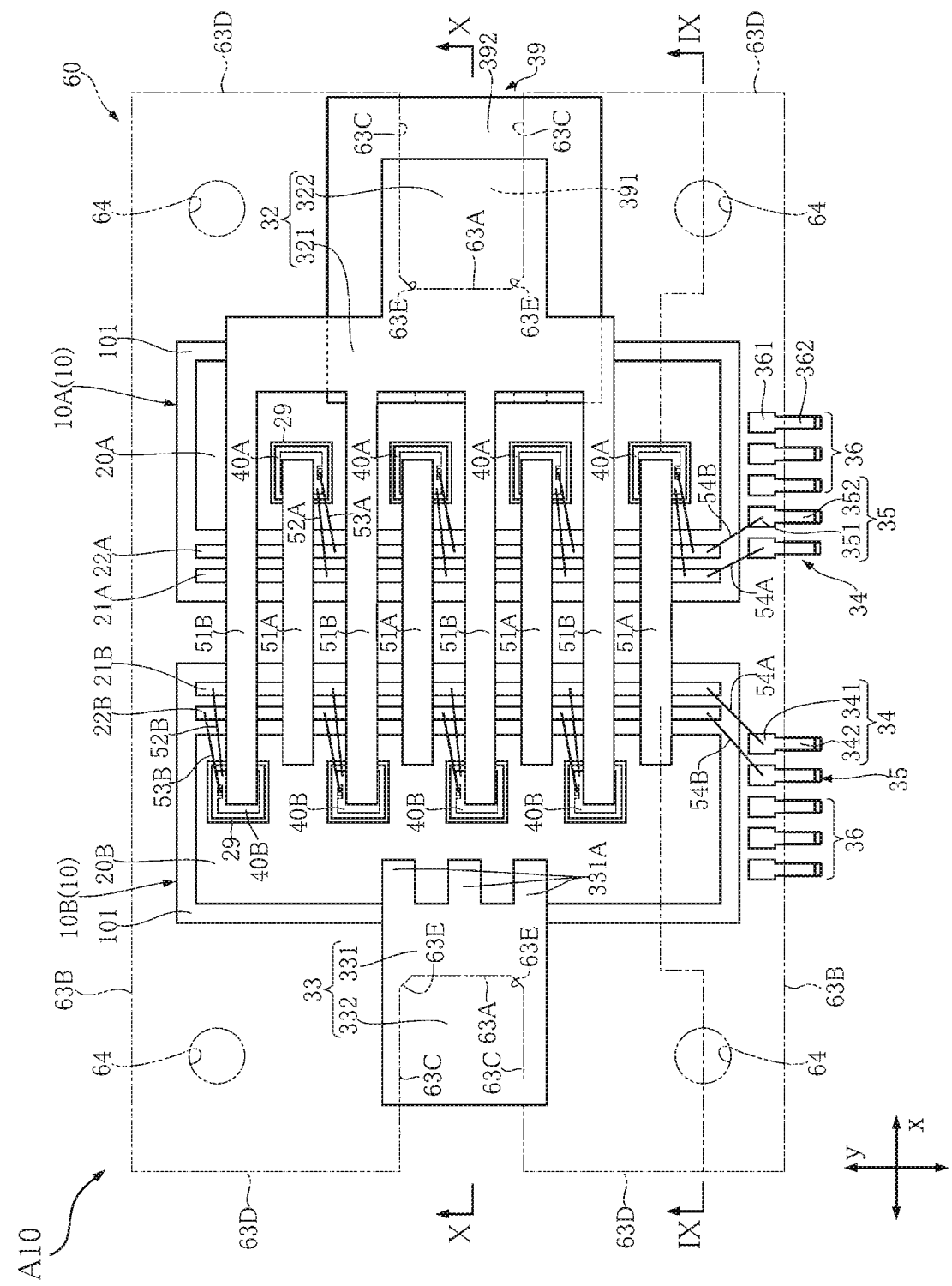
FIG. 3 is a plan view (seen through a sealing resin) of the semiconductor device shown in FIG. 1.
Figure 4:
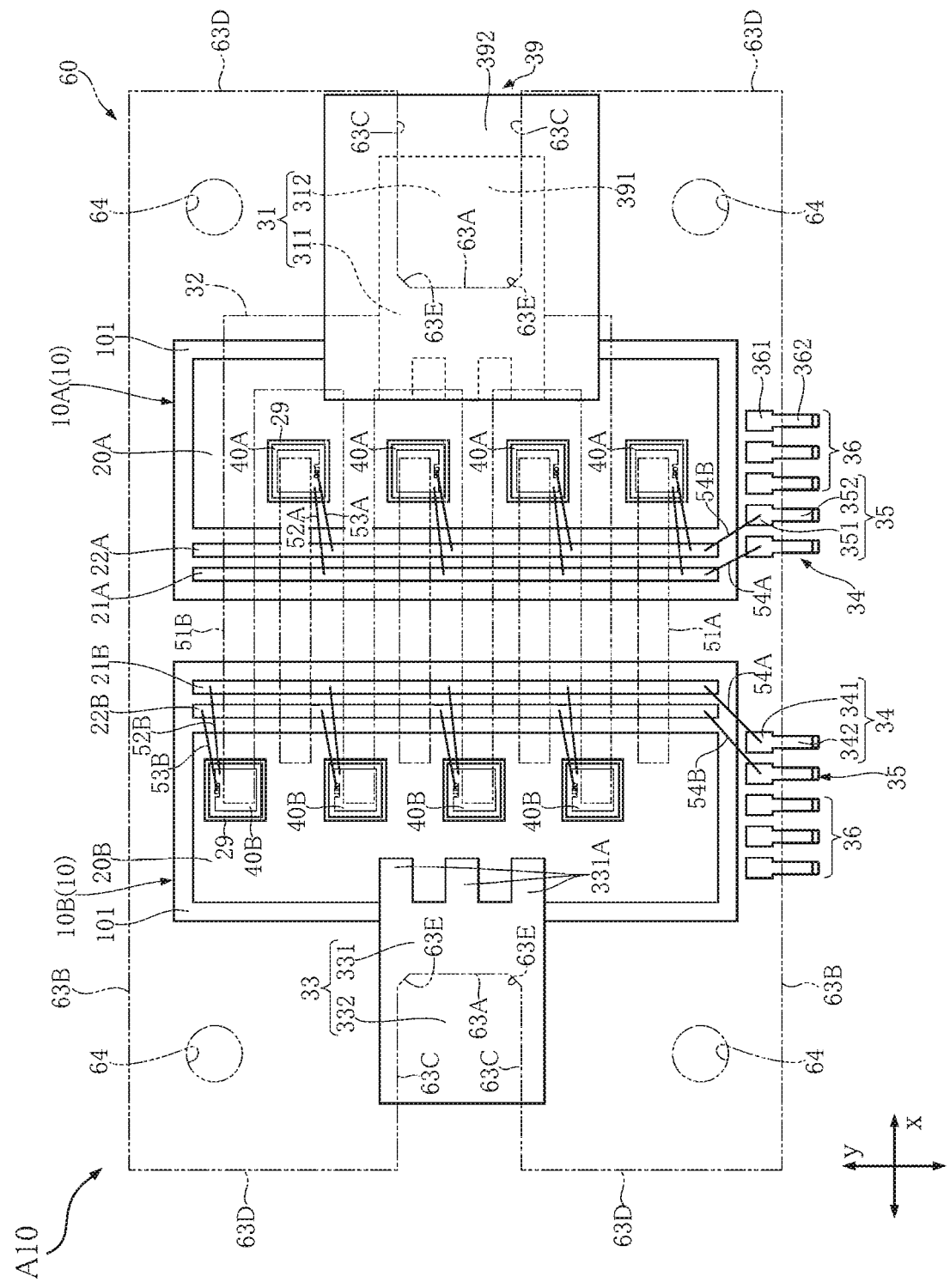
FIG. 4 is a plan view of the semiconductor device shown in FIG. 3 as seen through a second input terminal, a plurality of first leads and a plurality of second leads.

As shown in FIGS. 3, 4, 9 and 10, the semiconductor device A10 includes an insulating support member (insulating substrate) 10. In the illustrated example, the insulating support member 10 is made up of two substrates, i.e., a first substrate 10A and a second substrate 10B, but the present disclosure is not limited to such a configuration. The semiconductor device A10 also includes a first conductive layer 20A, a second conductive layer 20B, a first detection wiring layer 21A, a first gate wiring layer 22A, a plurality of first semiconductor elements 40A, a plurality of first leads 51A, a plurality of first detection conductors 52A and a plurality of first gate conductors 53A. In addition to these, the semiconductor device A10 includes a second detection wiring layer 21B, a second gate wiring layer 22B, a first input terminal 31 (see FIGS. 4 and 10), a second input terminal 32 (see FIGS. 3 and 10), an output terminal 33 (see FIGS. 3, 4 and 10), a pair of detection terminals 34 (see FIGS. 3 and 4), a pair of gate terminals 35, a plurality of dummy terminals 36, a plurality of second semiconductor elements 40B, a plurality of second leads 51B, a plurality of second detection conductors 52B, a plurality of second gate conductors 533, a sealing resin 60 and a metal substrate 69 (see FIGS. 9 and 10). In the illustrated example, the metal substrate 69 includes two regions corresponding to the first substrate 10A and the second substrate 10B, respectively, but the present disclosure is not limited to such a configuration. The semiconductor device A10 is a power converter (power module) in which the first semiconductor elements 40A and the second semiconductor elements 40B are MOSFETS, for example. The semiconductor device A10 may be used for a driving source of a motor, an inverter device for various electric appliances, and a DC/DC converter, for example. In FIG. 3, the sealing resin 60 is illustrated as transparent for convenience of understanding. In FIG. 4, the second input terminal 32, the first leads 51A and the second leads 51B, which are shown in FIG. 3, are also illustrated as transparent for convenience of understanding. In these figures, the sealing resin 60, the second input terminals 32, the first leads 51A and the second leads 51B are indicated by imaginary lines (two-dot chain lines).

Figure 1:
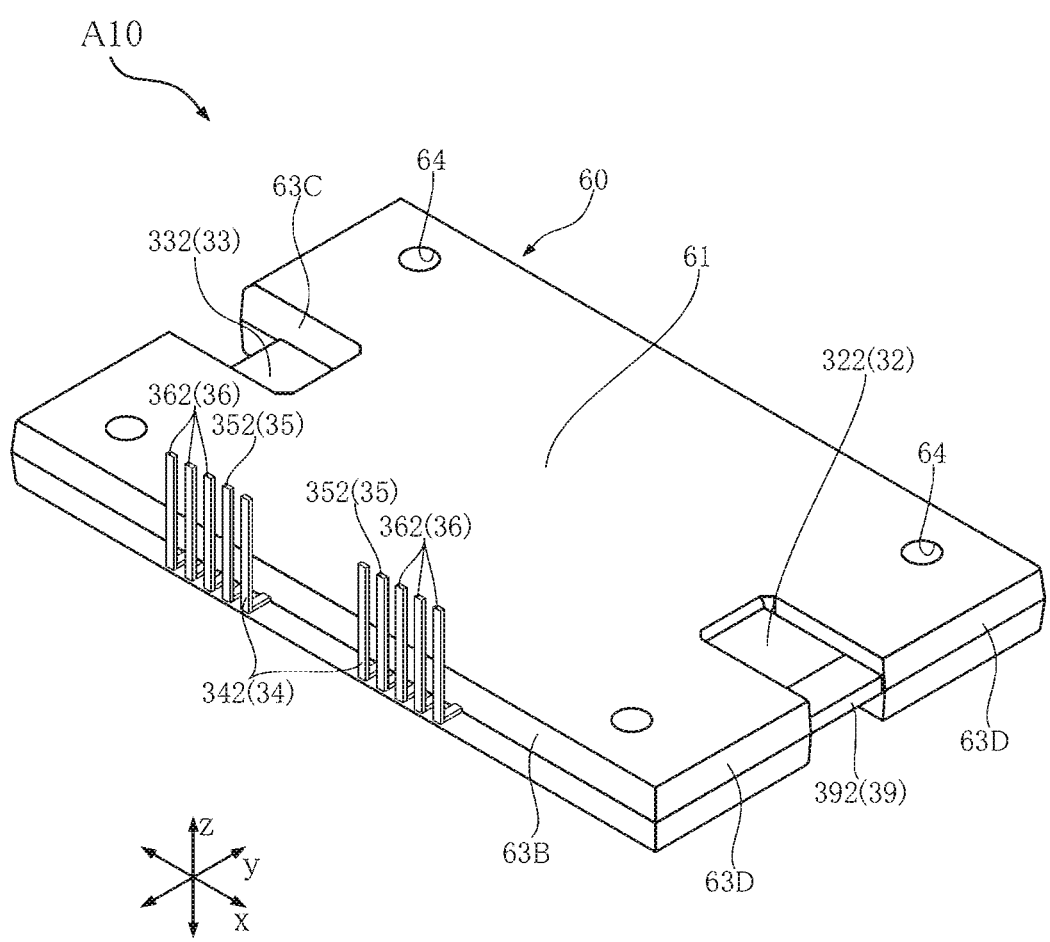
FIG. 1 is a perspective view of a semiconductor device according to a first embodiment.
Figure 2:
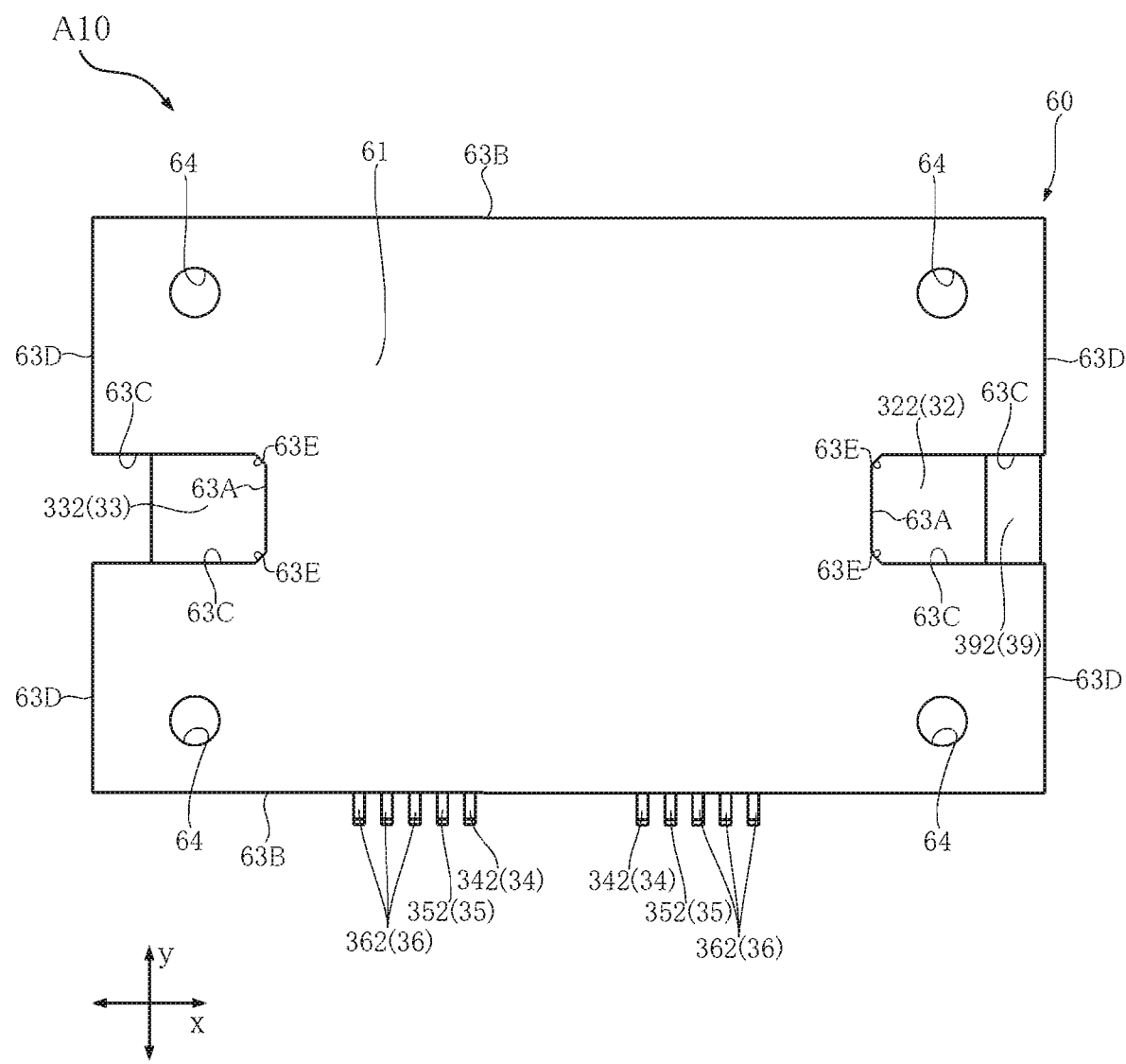
FIG. 2 is a plan view of the semiconductor device shown in FIG. 1.

In the description of the semiconductor device A10, the thickness direction of the insulating support member 10 is referred to as "thickness direction z". A direction orthogonal to the thickness direction z is referred to as "first direction x". The direction orthogonal to both the thickness direction z and the first direction x is referred to as "second direction y". As shown in FIGS. 1 and 2, the semiconductor device A10 is rectangular as viewed along the thickness direction z, i.e., as viewed in plan. The first direction x corresponds to the longitudinal direction of the semiconductor device A10. The second direction y corresponds to the widthwise direction of the semiconductor device A10. Also, in the description of the semiconductor device A10, for convenience of understanding, the side in the first direction x on which the first input terminal 31 and the second input terminal 32 are located is referred to as "first side in the first direction". The side in the first direction x on which the output terminal 33 is located is referred to as "second side in the first direction x". Note that the terms "thickness direction z", "first direction x", "second direction y", "first side in the first direction x" and "second side in the first direction" are applied to the description of a semiconductor device A20 given later.

Figure 9:
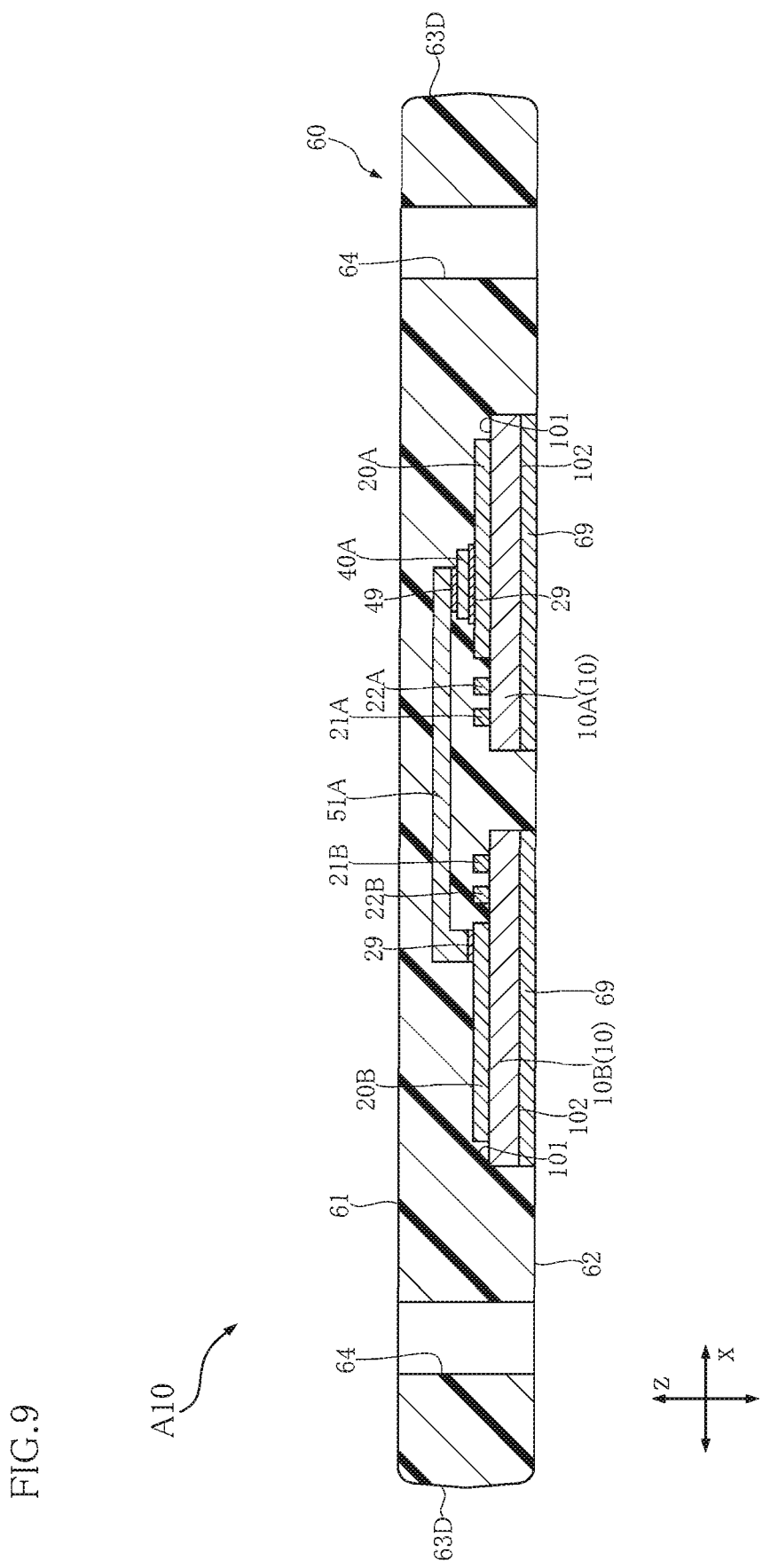
FIG. 9 is a sectional view taken along line IX-IX in FIG. 3.
Figure 10:
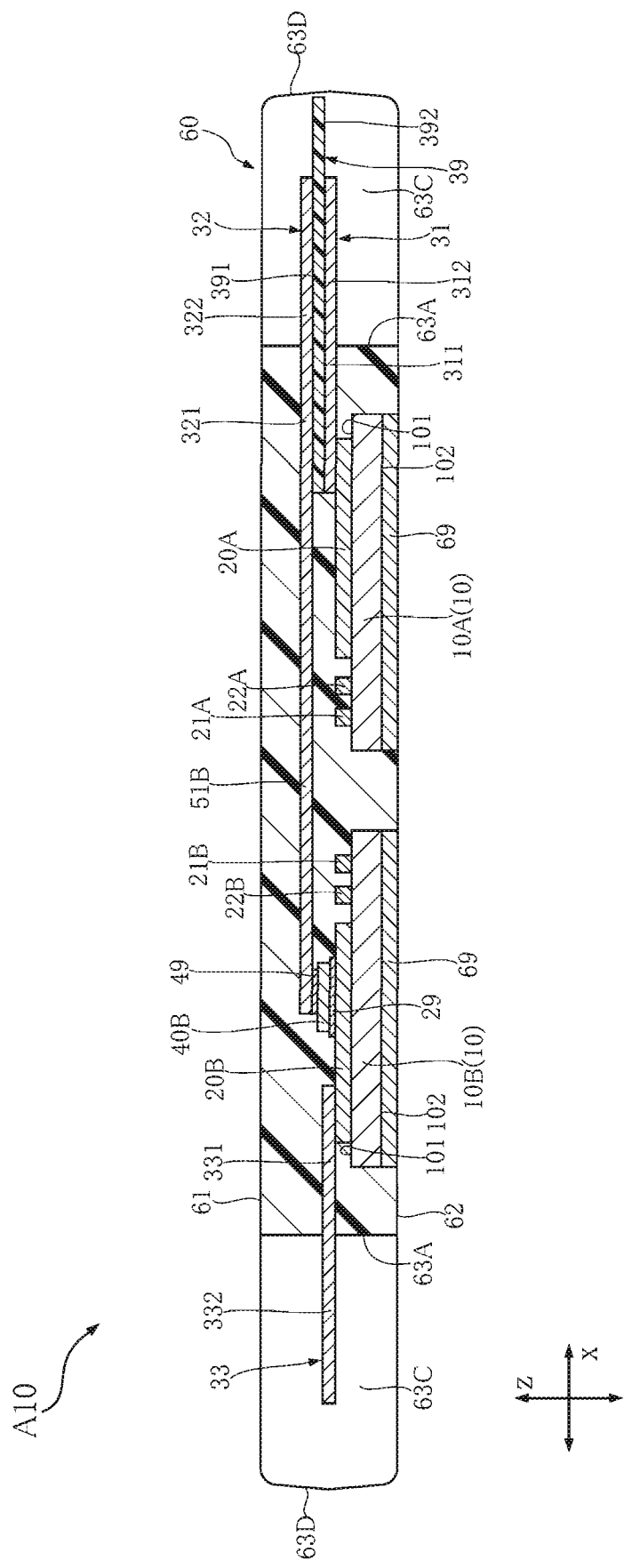
FIG. 10 is a sectional view taken along line X-X in FIG. 3.

As shown in FIGS. 3, 9 and 10, the first conductive layer 20A, the second conductive layer 20B and the metal substrate 69 are arranged on the insulating support member 10. The insulating support member 10 is electrically insulating. The insulating support member 10 is made of a ceramic material that has a high thermal conductivity. Aluminum nitride (AlN) is an example of such a ceramic material.

As shown in FIGS. 3, 9 and 10, in the semiconductor device A10, the insulating support member 10 includes two substrates, i.e., the first substrate 10A and the second substrate 10B. The first substrate 10A and the second substrate 10B are spaced apart from each other in the first direction x. The first substrate 10A is offset toward the first side in the first direction x. The second substrate 10B is offset toward the second side in the first direction x. As viewed along the thickness direction z, each of the first substrate 10A and the second substrate 10B has a rectangular shape with its longer sides extending along the second direction y. Note that the configuration of the insulating support member 10 is not limited to this and may be constituted of a single substrate.

As shown in FIGS. 9 and 10, each of the first substrate 10A and the second substrate 10B has a front surface 101 and a back surface 102. The front surface 101 faces the side in the thickness direction z on which the first conductive layer 20A and the second conductive layer 20B are arranged. The back surface 102 faces away from the front surface 101 in the thickness direction z.

As shown in FIGS. 3, 9 and 10, the first conductive layer 20A is arranged on the front surface 101 of the first substrate 10A (insulating support member 10). Along with the second conductive layer 20B, the first input terminal 31, the second input terminal 32 and the output terminal 33, the first conductive layer 20A forms a conduction path connecting the semiconductor elements 40A and the second semiconductor elements 403 to the outside of the semiconductor device A10. The first conductive layer 20A is made of a metal foil made of copper (Cu) or a copper alloy, for example. As viewed along the thickness direction z, the first conductive layer 20A has a rectangular shape with its longer sides extending along the second direction y. In the example of the semiconductor device A10, the first conductive layer 20A is formed of a single region, but in another example, the first conductive layer may be divided into a plurality of regions. The number of the regions and shape of the first conductive layer 20A can be set freely. Note that the surface of the first conductive layer 20A may be plated with silver (Ag).

As shown in FIGS. 3, 9 and 10, the first detection wiring layer 21A is arranged on the front surface 101 of the first substrate 10A. Thus, as viewed along the thickness direction z, the first detection wiring layer 21A overlaps with the front surface 101. The first detection wiring layer 21A is offset toward the second side in the first direction x from the first conductive layer 20A. The first detection wiring layer 21A is in the form of a strip elongated in the second direction y. The first detection wiring layer 21A may be made of the same metal foil as the first conductive layer 20A, for example. Note that the surface of the first detection wiring layer 21A may be plated with silver.

As shown in FIGS. 3, 9 and 10, the first gate wiring layer 22A is arranged on the front surface 101 of the first substrate 10A. Thus, as viewed along the thickness direction z, the first gate wiring layer 22A overlaps with the front surface 101. The first gate wiring layer 22A is located between the first conductive layer 20A and the first detection wiring layer 21A in the first direction x. The first gate wiring layer 22A is in the form of a strip elongated in the second direction y. The first gate wiring layer 22A may be made of the same metal foil as the first conductive layer 20A. Note that the surface of the first gate wiring layer 22A may be plated with silver.

As shown in FIGS. 3, 9 and 10, the second conductive layer 20B is arranged on the front surface 101 of the second substrate 10B (insulating support member 10). The second conductive layer 20B is made of a metal foil made of copper or a copper alloy, for example. As viewed along the thickness direction z, the second conductive layer 20B has a rectangular shape with its longer sides extending along the second direction y. In the example of the semiconductor device A10, the second conductive layer 20B is formed of a single region, but in another example, the second conductive layer may be divided into a plurality of regions. The number of the regions and shape of the second conductive layer 20B can be set freely. Note that the surface of the second conductive layer 20B may be plated with silver.

As shown in FIGS. 3, 9 and 10, the second detection wiring layer 21B is arranged on the front surface 101 of the second substrate 10B. Thus, as viewed along the thickness direction z, the second detection wiring layer 21B overlaps with the front surface 101. The second detection wiring layer 21B is offset toward the first side in the first direction x from the second conductive layer 20B. The second detection wiring layer 21B is in the form of a strip elongated in the second direction y. The second detection wiring layer 21B may be made of the same metal foil as the second conductive layer 20B, for example. Note that the surface of the second detection wiring layer 21B may be plated with silver.

As shown in FIGS. 3, 9 and 10, the second gate wiring layer 22B is arranged on the front surface 101 of the second substrate 10B. Thus, as viewed along the thickness direction z, the second gate wiring layer 22B overlaps with the front surface 101. The second gate wiring layer 22B is located between the second conductive layer 20B and the second detection wiring layer 21B in the first direction x. The second gate wiring layer 22B is in the form of a strip elongated in the second direction y. The second gate wiring layer 22B may be made of the same metal foil as the second conductive layer 20B. Note that the surface of the second gate wiring layer 22B may be plated with silver.

As shown in FIGS. 2-6, the first input terminal 31 and the second input terminal 32 are located on the first side in the first direction x. DC power (voltage), which is the power to be converted, is input to the first input terminal 31 and the second input terminal 32. The first input terminal 31 is the positive electrode (P terminal). The second input terminal 32 is the negative electrode (N terminal). As shown in FIG. 10, the second input terminal 32 is spaced apart from all of the first input terminal 31, the first conductive layer 20A and the second conductive layer 20B in the thickness direction z. The first input terminal 31 and the second input terminal 32 are metal plates. The material for the metal plates is copper or a copper alloy.

As shown in FIG. 4, the first input terminal 31 has a first connecting part 311 and a first terminal part 312. In the first input terminal 31, the boundary between the first connecting part 311 and the first terminal part 312 is a surface extending along the second direction y and the thickness direction z and containing a first side surface 63A (described later) of the sealing resin 60 located on the first side in the first direction x. The entirety of the first connecting part 311 is covered with the sealing resin 60. The part of the first connecting part 311 offset toward the second side of in the first direction x is shaped like comb teeth. This comb-teeth-like part is bonded for electrical connection to the surface of the first conductive layer 20A. Such bonding is performed by solder bonding or ultrasonic bonding, for example. Thus, the first input terminal 31 is electrically connected to the first conductive layer 20A.

Figure 5:
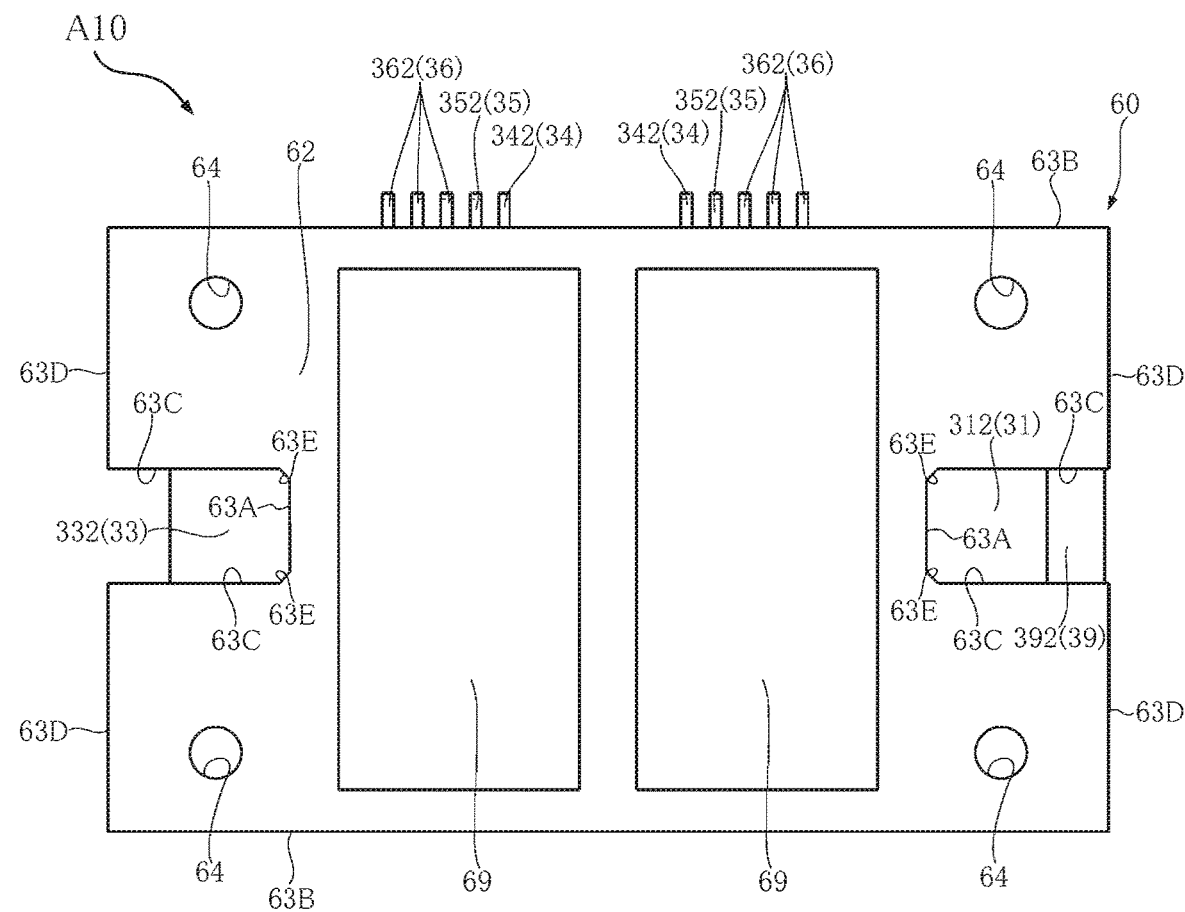
FIG. 5 is a bottom view of the semiconductor device shown in FIG. 1.

As shown in FIGS. 4 and 5, the first terminal part 312 extends from the sealing resin 60 toward the first side in the first direction x. As viewed along the thickness direction z, the first terminal part 312 is rectangular. Opposite sides of the first terminal part 312 in the second direction y are covered with the sealing resin 60. Other portions of the first terminal part 312 are exposed from the sealing resin 60. With such an arrangement, the first input terminal 31 is supported by both of the first conductive layer 20A and the sealing resin 60.

As shown in FIG. 3, the second input terminal 32 has a second connecting part 321 and a second terminal part 322. As viewed along the thickness direction z, the boundary between the second connecting part 321 and the second terminal part 322 of the second input terminal 32 corresponds to the boundary between the first connecting part 311 and the first terminal part 312 of the first input terminal 31. The second connecting part 321 is in the form of a strip elongated in the second direction y.

As shown in FIGS. 2 and 3, the second terminal part 322 extends from the sealing resin 60 toward the first side in the first direction x. As viewed along the thickness direction z, the second terminal part 322 is rectangular. Opposite sides of the second terminal part 322 in the second direction y are covered with the sealing resin 60. Other portions of the second terminal part 322 are exposed from the sealing resin 60. As shown in FIGS. 3 and 4, as viewed along the thickness direction z, the second terminal part 322 overlaps with the first terminal part 312 of the first input terminal 31. As shown in FIG. 10, the second terminal part 322 is offset from the first terminal part 312 in the sense of the thickness direction z in which the front surface 101 of the insulating support member 10 faces. Note that in the example of the semiconductor device A10, the shape of the second terminal part 322 is the same as that of the first terminal part 312.

Figure 6:
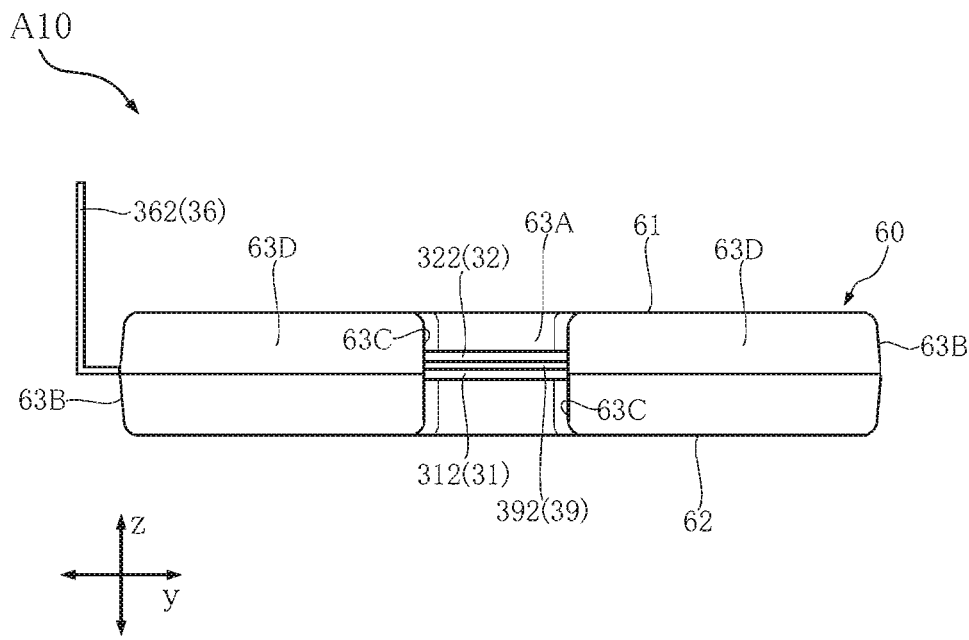
FIG. 6 is a right side view of the semiconductor device shown in FIG. 1.

As shown in FIGS. 6 and 10, an insulator 39 is interposed between the first terminal part 312 of the first input terminal 31 and the second terminal part 322 of the second input terminal 32 in the thickness direction z. The insulator 39 is a flat plate. The insulator 39 is electrically insulating and made of insulating paper, for example. As viewed along the thickness direction z, the entirety of the first input terminal 31 overlaps with the insulator 39. In the second input terminal 32, part of the second connecting part 321 and the entirety of the second terminal part 322 overlap with the insulator 39, as viewed along the thickness direction z. These portions overlapping with the insulator 39 as viewed along the thickness direction z are in contact with the insulator 39. The insulator 39 insulates the first input terminal 31 and the second input terminal 32 from each other. Parts of the insulator 39 (parts on the second side in the first direction x and opposite sides in the second direction y) are covered with the sealing resin 60.

As shown in FIGS. 3, 4 and 10, the insulator 39 includes an interposed part 391 and an extension 392. The interposed part 391 is located between the first terminal part 312 of the first input terminal 31 and the second terminal part 322 of the second input terminal 32 in the thickness direction z. The entirety of the interposed part 391 is sandwiched between the first terminal part 312 and the second terminal part 322. The extension 392 extends from the interposed part 391 toward the first side in the first direction x beyond the first terminal part 312 and the second terminal part 322. Thus, the extension 392 is offset from the first terminal part 312 and the second terminal part 322 toward the first side in the first direction x. Opposite sides of the extension 392 in the second direction y are covered with the sealing resin 60.

As shown in FIGS. 2-7 (excluding FIG. 6), the output terminal 33 is located on the second side in the first direction x. The AC power (voltage) obtained by power conversion by the first semiconductor elements 40A and the second semiconductor elements 40B is outputted from the output terminal 33. The output terminal 33 is a metal plate. The material for the metal plate is copper or a copper alloy. The output terminal 33 has a connecting part 331 and a terminal part 332. The boundary between the connecting part 331 and the terminal part 332 is a surface extending along the second direction y and the thickness direction z and containing a first side surface 63A (described later) of the sealing resin 60 located on the second side in the first direction x. The entirety of the connecting part 331 is covered with the sealing resin 60. The connecting part 331 is provided with a comb-teeth portion 331A on the first side in the first direction x. The comb-teeth portion 331A is bonded for electrical connection to the surface of the second conductive layer 20B. Such bonding is performed by solder bonding or ultrasonic bonding, for example. Thus, the output terminal 33 is electrically connected to the second conductive layer 20B. As shown in FIGS. 2-5, the terminal part 332 extends from the sealing resin 60 toward the second side in the first direction x. As viewed along the thickness direction z, the terminal part 332 is rectangular. Opposite sides of the terminal part 332 in the second direction y are covered with the sealing resin 60. Other portions of the terminal part 332 are exposed from the sealing resin 60. With such an arrangement, the output terminal 33 is supported by both of the second conductive layer 20B and the sealing resin 60.

As shown in FIGS. 3, 9 and 10, the first semiconductor elements 40A are bonded for electrical connection to the first conductive layer 20A. The first semiconductor elements 40A are arranged at predetermined intervals along the second direction y. The first semiconductor elements 40A form an upper arm circuit of the semiconductor device A10. Also, as shown in FIGS. 3, 9 and 10, the second semiconductor elements 40B are bonded for electrical connection to the second conductive layer 20B. The second semiconductor elements 40B are arranged at predetermined intervals along the second direction y. The second semiconductor elements 40B form a lower arm circuit of the semiconductor device A10. The first semiconductor elements 40A and the second semiconductor elements 40B are in staggered arrangement along the second direction y. In the illustrated example of the semiconductor device A10, the semiconductor device A10 includes four first semiconductor elements 40A and four second semiconductor element 40B. The number of the first semiconductor elements 40A and second semiconductor elements 40B is not limited to this and can be varied according to the performance required for the semiconductor device A10.

The first semiconductor elements 40A and the second semiconductor elements 40B are the same semiconductor elements. The semiconductor elements may be, for example, MOSFETs (Metal-Oxide-Semiconductor Field-Effect Transistor) made by using a semiconductor material mainly composed of silicon carbide (SiC). Note that the first semiconductor elements 40A and the second semiconductor elements 40B are not limited to MOSFETs and may be field-effect transistors including MISFETs (Metal-Insulator-Semiconductor Field-Effect Transistor) or bipolar transistors such as IGBTs (Insulated Gate Bipolar Transistor). In the description of semiconductor device A10, it is assumed that the first semiconductor elements 40A and the second semiconductor elements 40B are n-channel MOSFETs.

Figure 11:
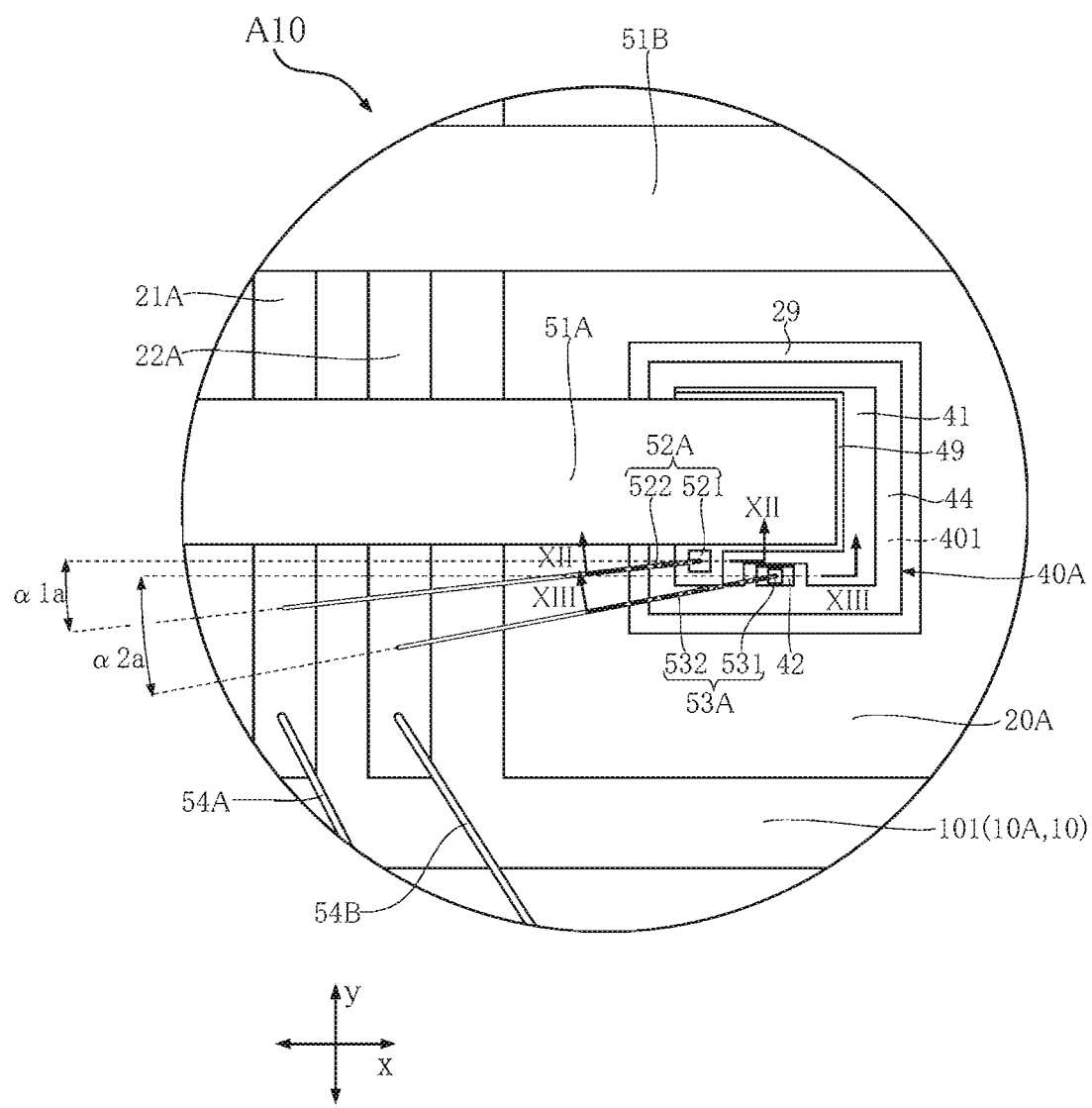
FIG. 11 is a view showing a part (at or near a first semiconductor element) of FIG. 3.
Figure 12:
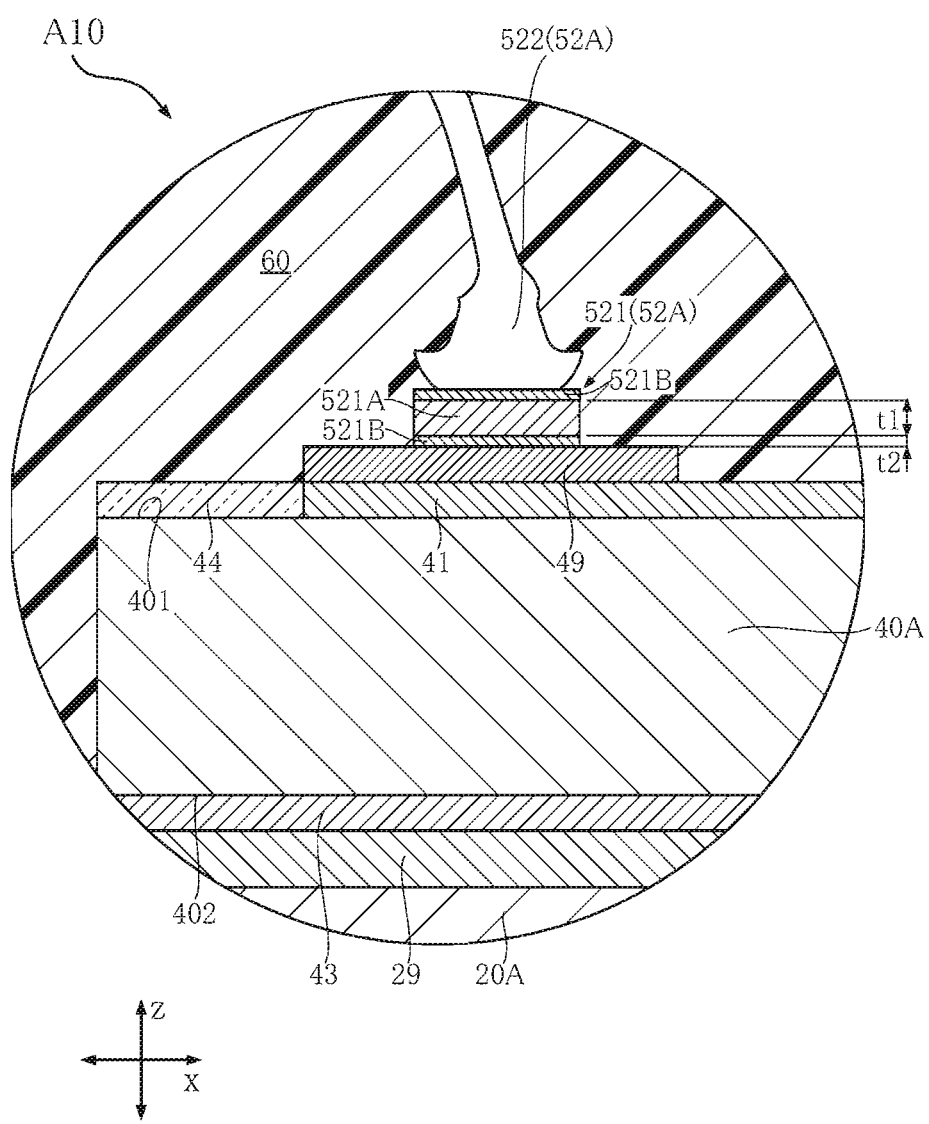
FIG. 12 is a sectional view taken along line XII-XII in FIG. 11.
Figure 13:
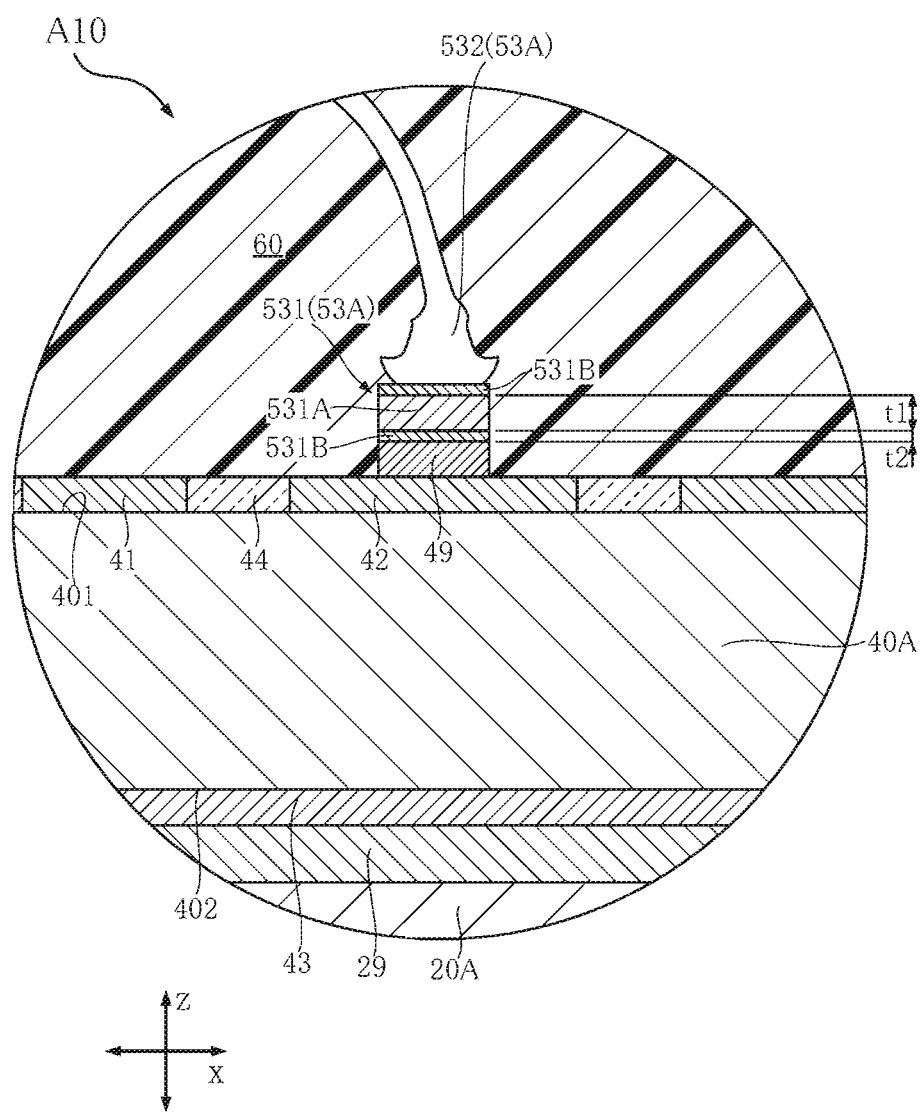
FIG. 13 is a sectional view taken along line XIII-XIII in FIG. 11.
Figure 14:
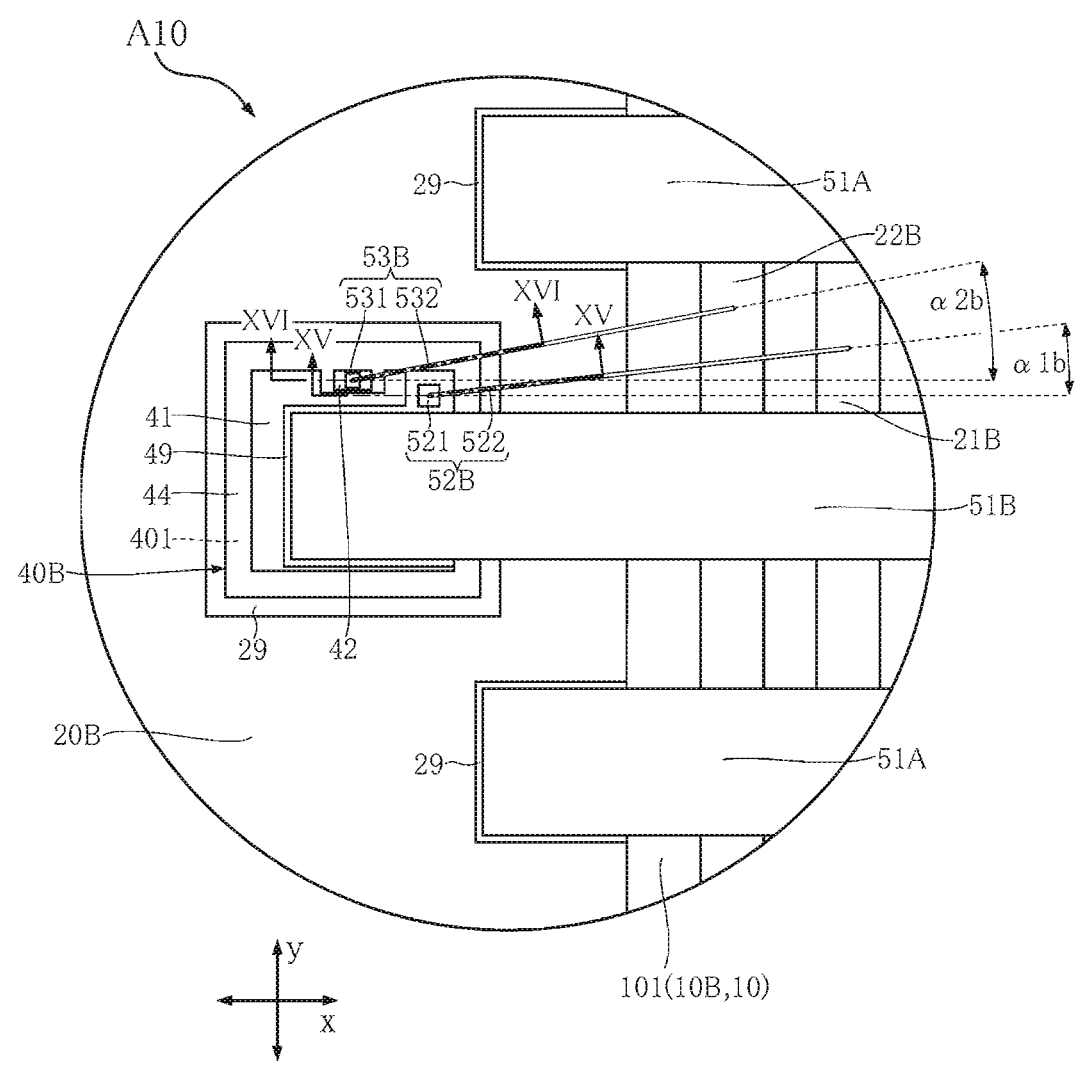
FIG. 14 is a view showing a part (at or near a second semiconductor element) of FIG. 3.

As shown in FIGS. 11 and 14, each of the first semiconductor elements 40A and the second semiconductor elements 40B is rectangular as viewed along the thickness direction z (square in the semiconductor device A10). As shown in FIGS. 11-16, each of the first semiconductor elements 40A and the second semiconductor elements 40B includes an element front surface 401, an element back surface 402, a first electrode 41, a second electrode 42, a third electrode 43 and an insulating film 44. The element front surface 401 and the element back surface 402 face away from each other in the thickness direction z. Of these, the element front surface 401 faces the side that the front surface 101 of the insulating support member 10 faces.

As shown in FIGS. 11-16, the first electrode 41 is on the element front surface 401, i.e., on the side that the front surface 101 of the insulating support member 10 faces in the thickness direction z. A source current flows from inside the first semiconductor element 40A or the second semiconductor element 403 to the first electrode 41.

As shown in FIGS. 11, 13, 14 and 16, the second electrode 42 is on the element front surface 401, i.e., on the side that the front surface 101 of the insulating support member 10 faces in the thickness direction z. A gate voltage for driving the first semiconductor element 40A or the second semiconductor element 403 is applied to the second electrode 42. The size of the second electrode 42 is smaller than that of the first electrode 41. In each of the first semiconductor elements 40A, the second electrode 42 is offset toward one side in the second direction y (the side on which the pair of detection terminals 34, the pair of gate terminals 35 and the dummy terminals 36 are located). In each of the second semiconductor elements 40B, the second electrode 42 is offset toward the other side in the second direction v.

As shown in FIGS. 12, 13, 15 and 16, the third electrode 43 is on the element back surface 402, i.e., on the side facing the front surface 101 of the insulating support member 10 in the thickness direction z. The third electrode 43 extends over the entirety of the element back surface 402. A drain current flows through the third electrode 43 into the first semiconductor element 40A or the second semiconductor element 40B. The third electrode 43 of each of the first semiconductor elements 40A is bonded for electrical connection to the first conductive layer 20A with a conductive first bonding layer 29. The first bonding layer 29 is made of a lead-free solder mainly composed of tin (Sn), for example. Thus, the third electrodes 43 of the first semiconductor elements 40A are electrically connected to the first conductive layer 20A. Also, the third electrode 43 of each of the second semiconductor elements 40B is bonded for electrical connection to the second conductive layer 20B with a first bonding layer 29. Thus, the third electrodes 43 of the second semiconductor elements 40B are electrically connected to the second conductive layer 20B.

As shown in FIGS. 11-16, the insulating film 44 is on the element front surface 401. The insulating film 44 is electrically insulating. As viewed along the thickness direction z, the insulating film 44 surrounds each of the first electrode 41 and second electrode 42. The insulating film 44 may be made up of, for example, a silicon dioxide ($SiO_2$) layer, a silicon nitride ($Si_3N_4$) layer and a polybenzoxazole (PBO) layer laminated in the mentioned order on the element front surface 401. Note that, in the insulating film 44, a polyimide layer may be used instead of the polybenzoxazole layer.

As shown in FIGS. 3 and 9, the first leads 51A are connected to the first electrodes 41 of the first semiconductor elements 40A and the second conductive layer 20B. As viewed along the thickness direction z, each of the first leads 51A is in the form of a strip elongated in the first direction x. The first leads 51A are made of copper or a copper alloy. The end of each first lead 51A on the first side in the first direction x is connected to the first electrode 41 of a respective first semiconductor element 40A with a conductive second bonding layer 49. The second bonding layer 49 is made of a lead-free solder mainly composed of tin (Sn) or baked silver, for example. The end of each first lead 51A on the second side in the first direction x is connected to the second conductive layer 20B with a first bonding layer 29. Thus, the first electrodes 41 of the first semiconductor elements 40A are electrically connected to the second conductive layer 20B.

As shown in FIGS. 3 and 10, the second leads 51B are connected to the first electrodes 41 of the second semiconductor elements 40B and the second input terminal 32. As viewed along the thickness direction z, each of the second leads 51B is in the form of a strip elongated in the first direction x. The second leads 51B are made of copper or a copper alloy. The end surface of each second lead 51B on the first side in the first direction x is directly connected to the second connecting part 321 of the second input terminal 32. Thus, the second leads 51B are integral with the second input terminal 32. The end of each second lead 51B on the second side in the first direction x is connected to the first electrode 41 of a respective second semiconductor element 40B with a second bonding layer 49. Thus, the first electrodes 41 of the second semiconductor elements 40B are electrically connected to the second input terminal 32.

As shown in FIGS. 3 and 11, the first detection conductors 52A are connected to the first electrodes 41 of the first semiconductor elements 40A and the first detection wiring layer 21A. Thus, the first electrodes 41 of the first semiconductor elements 40A are electrically connected to the first detection wiring layer 21A. As shown in FIGS. 11 and 12, each of the first detection conductors 52A has a pillow part 521 and a wire part 522.

As shown in FIG. 12, the pillow part 521 of each first detection conductor 52A is connected to the first electrode 41 of a respective first semiconductor element 40A with a second bonding layer 49. As shown in FIG. 11, the pillow part 521 is rectangular as viewed along the thickness direction z. The pillow part 521 has a first layer 521A and a pair of second layers 521B. The first layer 521A is made of an alloy containing iron (Fe) and nickel (Ni). Examples of the alloy include invar (Fe-36Ni), super invar (Fe-32Ni-5Co) and Kovar. The paired second layers 521B are made of a metal. Examples of the metal include copper, a copper alloy, aluminum and an aluminum alloy. The first layer 521A is sandwiched between the paired second layers 521B in the thickness direction z. In this way, the pillow part 521 is a laminate of a plurality of metal layers in the thickness direction z. The ratio of the thickness t1 of the first layer 521A and the thickness t2 of each second layer 521B may be t1:t2=8:1, for example. The coefficient of linear expansion of the pillow part 521 having such a configuration is in a range of 0 to $8\times10^{-6}$/° C. In contrast, the coefficient of linear expansion of the first conductive layer 20A is about $16\times10^{-6}$/° C. Thus, the coefficient of linear expansion of the pillow part 521 is smaller than that of the first conductive layer 20A. Note that the first layer 521A may be made of a semiconductor material. As the semiconductor material, use may be made of silicon (Si), which has a relatively low electrical resistivity. In such a case again, the coefficient of linear expansion of the pillow part 521 is smaller than that of the first conductive layer 20A.

As shown in FIG. 11, the wire part 522 of each first detection conductor 52A is connected to the pillow part 521 of the first detection conductor 52A and the first detection wiring layer 21A. The wire part 522 is inclined at an inclination angle α1a with respect to the first direction x. The wire part 522 may be made of aluminum, an aluminum alloy, copper, a copper alloy or a clad material made by some combination of these.

Figure 15:
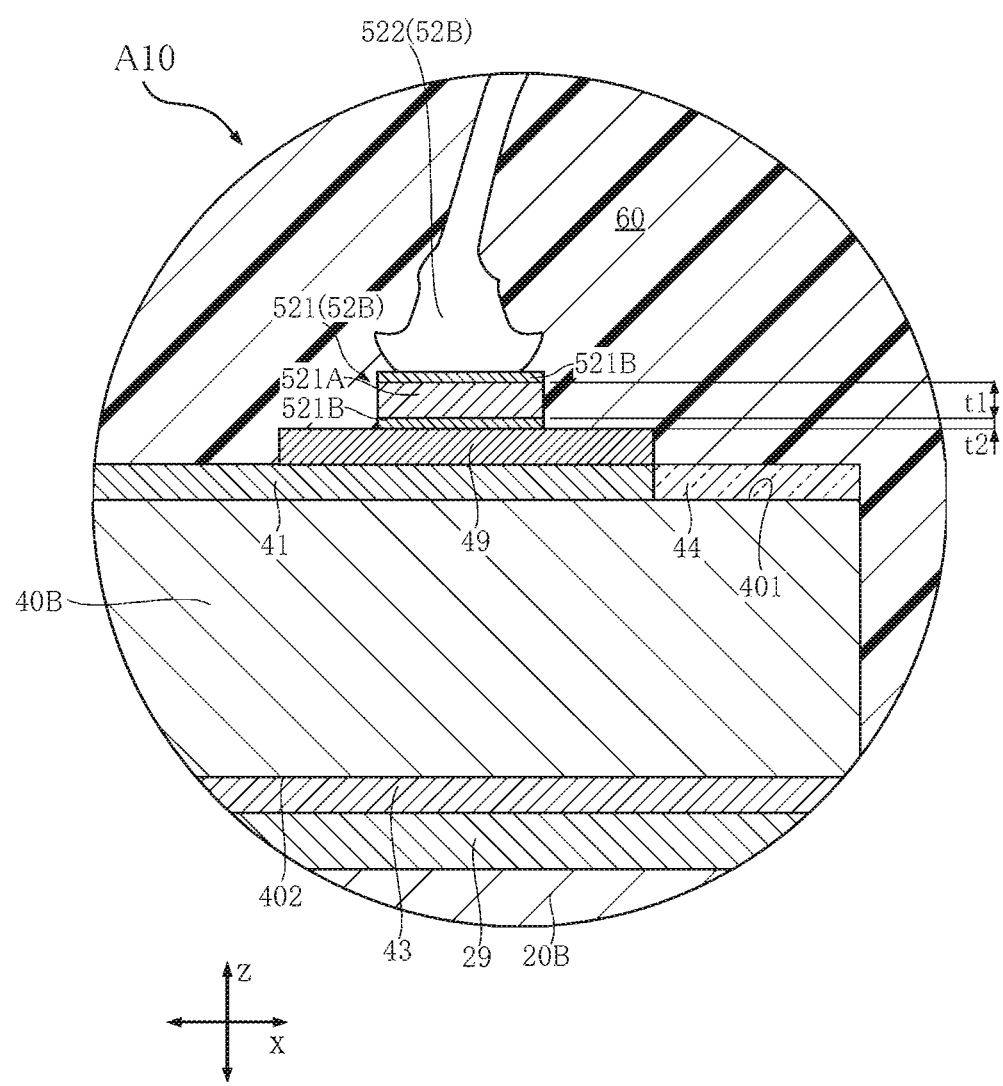
FIG. 15 is a sectional view taken along line XV-XV in FIG. 14.

As shown in FIGS. 3 and 14, the second detection conductors 52B are connected to the first electrodes 41 of the second semiconductor elements 40B and the second detection wiring layer 21B. Thus, the first electrodes 41 of the second semiconductor elements 40B are electrically connected to the second detection wiring layer 21B. As shown in FIGS. 14 and 15, each of the second detection conductors 52B has a pillow part 521 and a wire part 522. The pillow part 521 of each second detection conductor 52B is connected to the first electrode 41 of a respective second semiconductor element 403 with a second bonding layer 49. The wire part 522 of each second detection conductor 52B is connected to the pillow part 521 of the second detection conductor 52B and the second detection wiring layer 21B. The wire part 522 of the second detection conductor 52B is inclined at an inclination angle α1b with respect to the first direction x. Other configurations of the pillow part 521 and the wire part 522 of each second detection conductor 52B are the same as those of the pillow part 521 and the wire part 522 of each first detection conductor 52A, so that the description of such configurations is omitted. Note that the coefficient of linear expansion of the second conductive layer 20B is generally equal to that of the first conductive layer 20A. Thus, the coefficient of linear expansion of the pillow part 521 is smaller than that of the second conductive layer 20B.

As shown in FIGS. 3 and 11, the first gate conductors 53A are connected to the second electrodes 42 of the first semiconductor elements 40A and the first gate wiring layer 22A. Thus, the second electrodes 42 of the first semiconductor elements 40A are electrically connected to the first gate wiring layer 22A. As shown in FIGS. 11 and 13, each of the first gate conductors 53A has a pillow part 531 and a wire part 532.

As shown in FIG. 13, the pillow part 531 of each first gate conductor 53A is connected to the second electrode 42 of a respective first semiconductor element 40A with a second bonding layer 49. As shown in FIG. 11, the pillow part 531 is rectangular as viewed along the thickness direction z. The pillow part 531 has a first layer 531A and a pair of second layers 531B. The first layer 531A is made of an alloy containing iron and nickel. Examples of the alloy are the same as those for the first layer 521A of the pillow part 521 of the first detection conductor 52A. The paired second layers 531B are made of a metal. Examples of the metal are the same as those for the second layers 521B of the pillow part 521 of the first detection conductor 52A. The first layer 531A is sandwiched between the paired second layers 531B in the thickness direction z. In this way, the pillow part 531 is a laminate of a plurality of metal layers in the thickness direction z. The ratio of the thickness t1 of the first layer 531A and the thickness t2 of each second layer 531B may be t1:t2=8:1, for example. The coefficient of linear expansion of the pillow part 531 having such a configuration is in a range of 0 to $8 \times 10^{-6}/°$ C. contrast, the coefficient of linear expansion of the second conductive layer 20B is about $16 \times 10^{-6}/°$ C. Thus, the coefficient of linear expansion of the pillow part 531 is smaller than that of the second conductive layer 20B. Note that the first layer 531A may be made of a semiconductor material. The example of the semiconductor material is the same as that for the first layer 521A of the pillow part 521 of the first detection conductors 52A. In such a case again, the coefficient of linear expansion of the pillow part 531 is smaller than that of the second conductive layer 20B.

As shown in FIG. 11, the wire part 532 of each first gate conductor 53A is connected to the pillow part 531 of the first gate conductor 53A and the first gate wiring layer 22A. The wire part 532 of the first gate conductor 53A is inclined at an inclination angle α2a with respect to the first direction x. Examples of the material for the wire part 532 are the same as those for the wire part 522 of the first detection conductor 52A.

Figure 16:
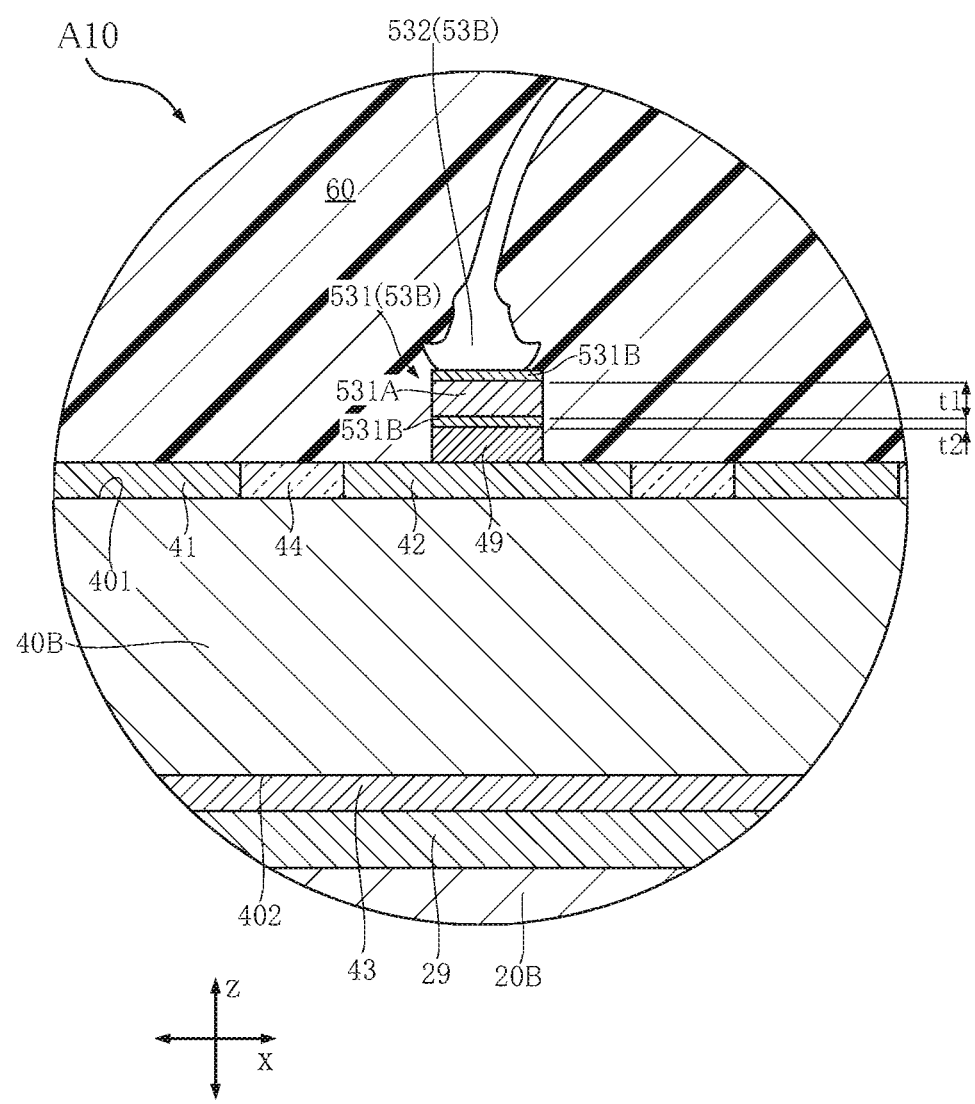
FIG. 16 is a sectional view taken along line XVI-XVI in FIG. 14.

As shown in FIGS. 3 and 14, the second gate conductors 533 are connected to the second electrodes 42 of the second semiconductor elements 40B and the second gate wiring layer 22B. Thus, the second electrodes 42 of the second semiconductor elements 40B are electrically connected to the second gate wiring layer 22B. As shown in FIGS. 14 and 16, each of the second gate conductors 533 has a pillow part 531 and a wire part 532. The pillow part 531 of each second detection conductor 533 is connected to the second electrode 42 of a respective second semiconductor element 40B with a second bonding layer 49. The wire part 532 of each second gate conductor 53B is connected to the pillow part 531 of the second gate conductor 53B and the second gate wiring layer 22B. The wire part 532 of the second gate conductor 53B is inclined at an inclination angle α2b with respect to the first direction x. Other configurations of the pillow part 531 and the wire part 532 of each second gate conductor 53B are the same as those of the pillow part 531 and the wire part 532 of each first gate conductor 53A, so that the description of such configurations is omitted. Note that the coefficient of linear expansion of the second conductive layer 20B is generally equal to that of the first conductive layer 20A. Thus, the coefficient of linear expansion of the pillow part 531 is smaller than that of the second conductive layer 20B.

As shown in FIG. 3, the pair of detection terminals 34, the pair of gate terminals 35 and the dummy terminals 36 are adjacent to the insulating support member 10 in the second direction y. These terminals are arranged side by side along the first direction x. In the semiconductor device A10, all of the detection terminals 34, the gate terminals 35 and the dummy terminals 36 are made from a same lead frame.

As shown in FIG. 3, of the pair of the detection terminals 34, one is located adjacent to the first substrate 10A and the other one adjacent to the second substrate 10B. The voltage (corresponding to the source current) applied to the first electrodes 41 of the first semiconductor elements 40A or the second semiconductor elements 40B is detected from each of the detection terminals 34. Each of the detection terminals 34 has a connecting part 341 and a terminal part 342. The connecting part 341 is covered with the sealing resin 60. Thus, the detection terminals 34 are supported by the sealing resin 60. Note that the surface of the connecting part 341 may be plated with silver, for example. The terminal part 342 is connected to the connecting part 341 and exposed from the sealing resin 60 (see FIG. 8). The terminal part 342 is L-shaped as viewed along the first direction x.

As shown in FIG. 3, the paired gate terminals 35 are located adjacent to the paired detection terminal 34 in the first direction x. To each of the gate terminals 35, a gate voltage for driving the first semiconductor elements 40A or the second semiconductor element 40B is applied. Each of the gate terminals 35 has a connecting part 351 and a terminal part 352. The connecting part 351 is covered with the sealing resin 60. Thus, the gate terminals 35 are supported by the sealing resin 60. Note that the surface of the connecting part 351 may be plated with silver, for example. The terminal part 352 is connected to the connecting part 351 and exposed from the sealing resin 60 (see FIG. 8). The terminal part 352 is L-shaped as viewed along the first direction x.

Figure 7:
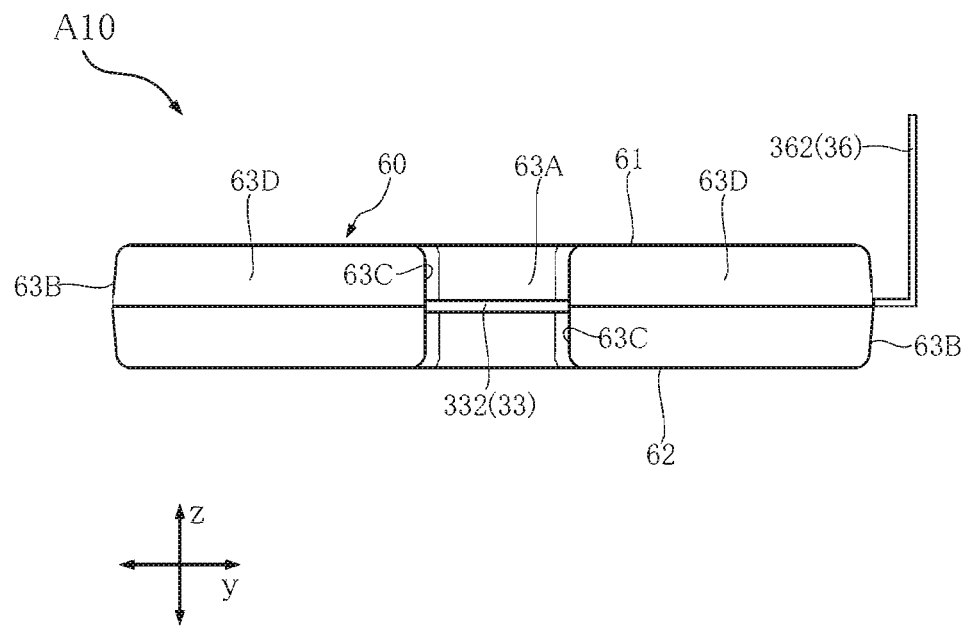
FIG. 7 is a left side view of the semiconductor device shown in FIG. 1.
Figure 8:
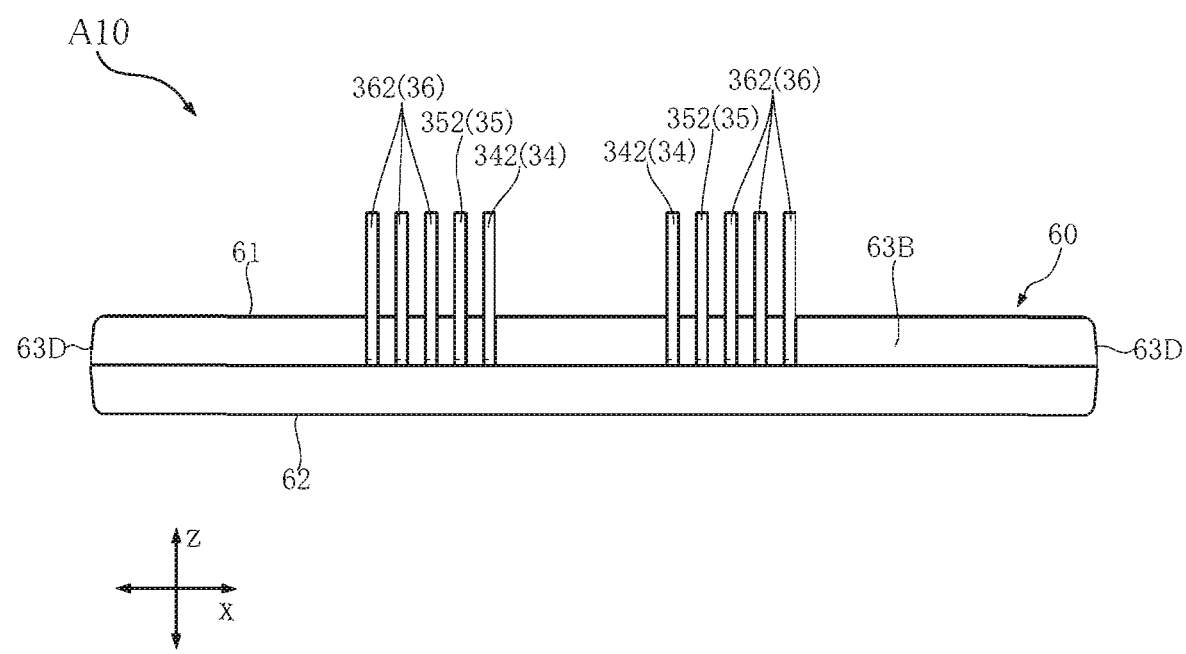
FIG. 8 is a front view of the semiconductor device shown in FIG. 1.

As shown in FIG. 3, the dummy terminals 36 are located opposite the detection terminals 34 with respect to the gate terminals 35 in the first direction x. In the example of the semiconductor device A10, six dummy terminals 36 are provided. Of these, three dummy terminals 36 are offset toward the first side in the first direction x. The remaining three dummy terminals 36 are offset toward the second side in the first direction x. Note that the number of the dummy terminals is not limited to this. Also, the semiconductor device A10 may not include the dummy terminal 36. Each of the dummy terminals 36 has a connecting part 361 and a terminal part 362. The connecting part 361 is covered with the sealing resin 60. Thus, the dummy terminals 36 are supported by the sealing resin 60. Note that the surface of the connecting part 361 may be plated with silver, for example. The terminal part 362 is connected to the connecting part 361 and exposed from the sealing resin 60 (see FIG. 8). As shown in FIGS. 6 and 7, the terminal part 362 is L-shaped as viewed along the first direction x. Note that the shape of the terminal parts 342 of the detection terminals 34 and the shape of the terminal parts 352 of the gate terminals 35 are the same as that of the terminal parts 362.

As shown in FIG. 3, the semiconductor device A10 further includes a pair of first wires 54A and a pair of second wires 54B. The first wires 54A and the second wires 54B are made of aluminum, for example.

As shown in FIG. 3, the first wires 54A are connected to the first detection wiring layer 21A or the second detection wiring layer 21B and the detection terminals 34. In the detection terminals 34, the first wires 54A are connected to the surfaces of the connecting parts 341. Thus, one of the detection terminals 34 that is adjacent to the first substrate 10A is electrically connected to the first electrodes 41 of the first semiconductor elements 40A, whereas the other one of the detection terminals 34 that is adjacent to the second substrate 10B is electrically connected to the first electrodes 41 of the second semiconductor elements 40B.

As shown in FIG. 3, the second wires 54B are connected to the first gate wiring layer 22A or the second gate wiring layer 22B and the gate terminals 35. In the gate terminals 35, the second wires 54B are connected to the surfaces of the connecting parts 351. Thus, one of the gate terminals 35 that is adjacent to the first substrate 10A is electrically connected to the second electrodes 42 of the first semiconductor elements 40A, whereas the other one of the gate terminals 35 that is adjacent to the second substrate 10B is electrically connected to the second electrodes 42 of the second semiconductor elements 40B.

As shown in FIGS. 9 and 10, the sealing resin 60 covers the insulating support member 10, the first conductive layer 20A, the second conductive layer 20B, the first semiconductor elements 40A and the second semiconductor elements 40B. The sealing resin 60 further covers the first leads 51A, the second leads 51B, the first detection conductors 52A, the second detection conductors 52B, the first gate conductors 53A, the second gate conductors 533, the first wires 54A and the second wires 548. The sealing resin 60 may be made of black epoxy resin, for example. As shown in FIGS. 2 and 5-8, the sealing resin 60 has a top surface 61, a bottom surface 62, a pair of first side surfaces 63A, a pair of second side surfaces 638, a plurality of third side surfaces 63C, a plurality of fourth side surfaces 63D, a plurality of beveled parts 638 and a plurality of mounting holes 64.

As shown in FIGS. 9 and 10, the top surface 61 faces the side that the front surface 101 of the insulating support member 10 faces in the thickness direction z. The bottom surface 62 faces away from the top surface 61 in the thickness direction z. As shown in FIG. 5, the metal substrate 69 is exposed from the bottom surface 62. The bottom surface 62 has a frame-like shape surrounding the metal substrate 69.

As shown in FIGS. 2 and 5-7, the paired first side surfaces 63A are connected to both of the top surface 61 and the bottom surface 62 and face in the first direction x. From the first side surface 63A on the first side in the first direction x, the first terminal part 312 of the first input terminal 31 and the second terminal part 322 of the second input terminal 32 extend toward the first side in the first direction x. From the first side surface 63A on the second side in the first direction x, the terminal part 332 of the output terminal 33 extends toward the second side in the first direction x. In this way, part of each of the first input terminal 31 and the second input terminal 32 is exposed from the sealing resin 60 on the first side in the first direction x. Also, part of the output terminal 33 is exposed from the sealing resin 60 on the second side in the first direction x.

As shown in FIGS. 2 and 5-8, the paired second side surfaces 633 are connected to both of the top surface 61 and the bottom surface 62 and face in the second direction y. From one of the second side surfaces 633 are exposed the terminal parts 342 of the detection terminals 34, the terminal parts 352 of the gate terminals 35 and the terminal parts 362 of the dummy terminals 36.

As shown in FIGS. 2 and 5-7, the third side surfaces 63C are connected to both of the top surface 61 and the bottom surface 62 and face in the second direction y. The third side surfaces 63C include a pair of third side surfaces 63C located on the first side in the first direction x and a pair of third side surfaces 63C located on the second side in the first direction x. In each of the first side and the second side in the first direction x, the paired third side surfaces 63C face each other in the second direction y. Also, in each of the first side and the second side in the first direction x, the paired third side surfaces 63C are connected to opposite ends of the relevant first side surface 63A in the second direction y.

As shown in FIGS. 2 and 5-8, the fourth side surfaces 63D are connected to both of the top surface 61 and the bottom surface 62 and face in the first direction x. In the first direction x, the fourth side surfaces 63D are offset from the first side surfaces 63A toward the outside of the semiconductor device A10. The fourth side surfaces 63D include a pair of fourth side surfaces 63D located on the first side in the first direction x and a pair of fourth side surfaces 63D located on the second side in the first direction x. In each of the first side and the second side in the first direction x, the opposite ends of each fourth side surface 63D in the second direction y are connected to the relevant second side surface 63E and the relevant third side surface 63C.

As shown in FIGS. 2 and 5, each of the beveled parts 63E is located at the boundary between a first side surface 63A and a third side surface 63C. As viewed along the thickness direction z, the beveled parts 63E are inclined with respect to both of the first direction x and the second direction y.

As shown in FIG. 9, the mounting holes 64 penetrate the sealing resin 60 from the top surface 61 to the bottom surface 62 in the thickness direction z. The mounting holes 64 are used in attaching the semiconductor device A10 to a heat sink (not shown). As shown in FIGS. 2 and 5, the edge of the mounting holes 64 is circular as viewed along the thickness direction z. The mounting holes 64 are located at the four corners of the sealing resin 60 as viewed along the thickness direction z.

As shown in FIGS. 9 and 10, the metal substrate 69 is provided on the entirety of the back surface 102 of the insulating support member 10 (the first substrate 10A and the second substrate 10B). Accordingly, the metal substrate 69 includes two region spaced apart from each other in the first direction x. As shown in FIG. 5, the metal substrate 69 is exposed from the bottom surface 62 of the sealing resin 60. The metal substrate 69 is made of a metal foil made of copper (Cu) or a copper alloy, for example. The metal substrate 69 is used in attaching the semiconductor device A10 to a heat sink, along with the mounting holes 64 of the sealing resin 60.

First Variation of the First Embodiment

A semiconductor device A11, which is the first variation of the semiconductor device A10, is described below based on FIGS. 17 and 18. The semiconductor device A11 differs from the semiconductor device A10 in configuration of the pillow parts 521 of the first detection conductors 52A and the second detection conductors 52B and the pillow parts 531 of the first gate conductors 53A and the second gate conductors 53B.

Figure 17:
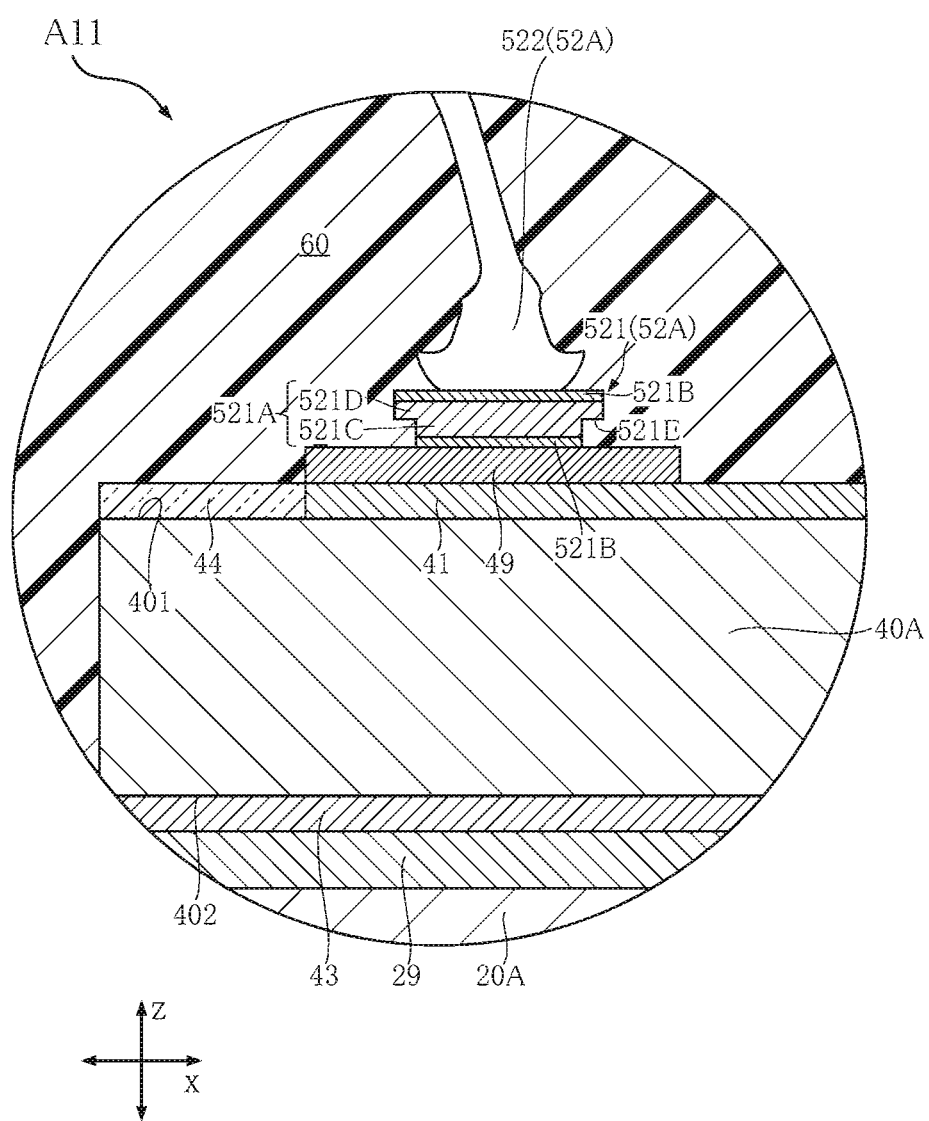
FIG. 17 is a sectional view of a part (at or near a first semiconductor element) of a semiconductor device according to a first variation of the first embodiment.

As shown in FIG. 17, the first layer 521A of the pillow part 521 of each first detection conductor 52A has a lower layer portion 521C, an upper layer portion 521D and a frame surface 521E. The lower layer portion 521C is located on the lower side of the first layer 521A. The second layer 521B located at the lower end of the pillow part 521 adjoins the lower layer portion 521C. The upper layer portion 521D is connected to the upper end of the lower layer portion 521C. As viewed along the thickness direction z, the area of the upper layer portion 521D is larger than that of the lower layer portion 521C. The second layer 521B located at the upper end of the pillow part 521 adjoins the upper layer portion 521D. Thus, as viewed along the thickness direction z, the second layer 521B adjoining the upper layer portion 521D has a larger area than the other second layer 521B adjoining the lower layer portion 521C. The frame surface 521E faces the first electrode 41 of the first semiconductor element 40A. As viewed along the thickness direction z, the frame surface 521E surrounds the entire periphery of the lower layer portion 521C. Though the illustration is omitted, the first layer 521A of the pillow part 521 of each second detection conductor 528 also has a lower layer portion 521C, an upper layer portion 521D and a frame surface 521E. These have the same configurations as the lower layer portion 521C, the upper layer portion 521D and the frame surface 521E of the pillow part 521 of the first detection conductors 52A, so that the description is omitted.

Figure 18:
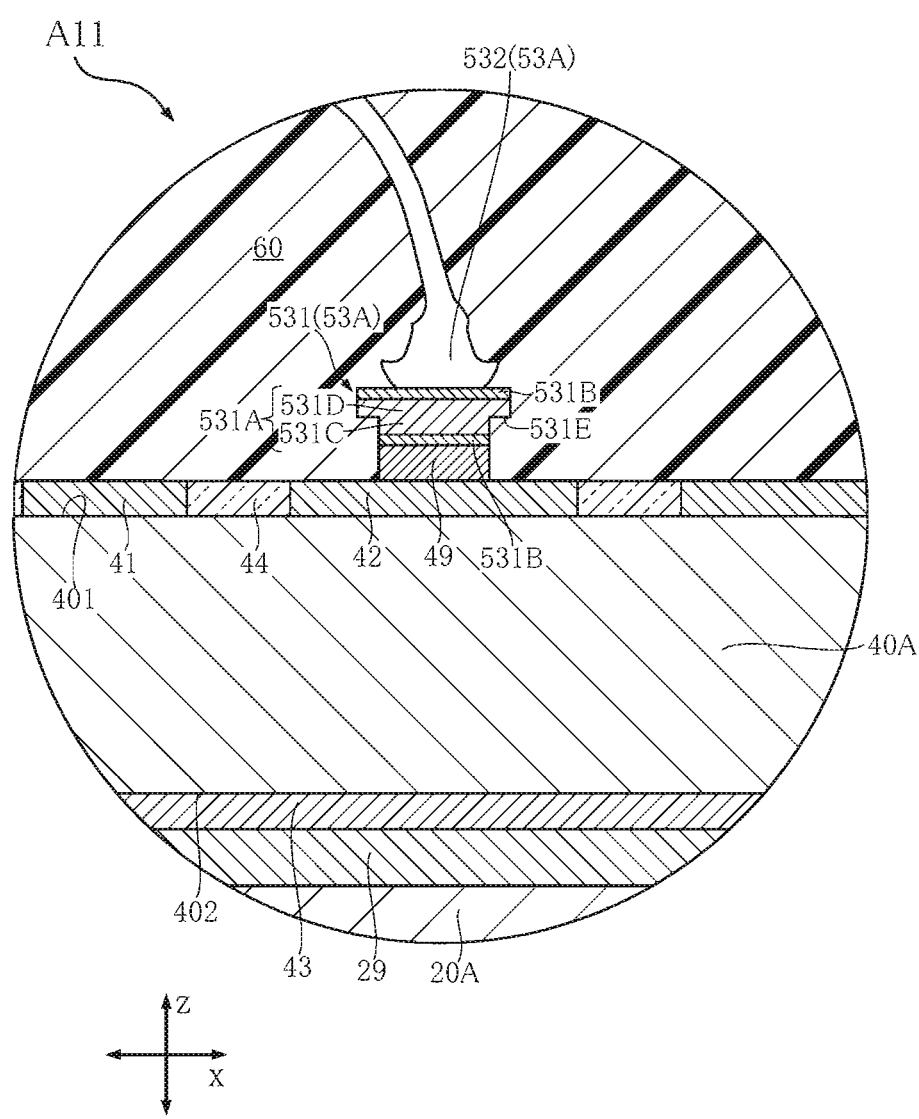
FIG. 18 is a sectional view of a part (at or near a first semiconductor element) of the semiconductor device shown in FIG. 17.

As shown in FIG. 18, the first layer 531A of the pillow part 531 of each first gate conductor 53A has a lower layer portion 531C, an upper layer portion 531D and a frame surface 531E. The lower layer portion 531C is located on the lower side of the first layer 531A. The second layer 531B located at the lower end of the pillow part 531 adjoins the lower layer portion 531C. The upper layer portion 531E is connected to the upper end of the lower layer portion 531C. As viewed along the thickness direction z, the area of the upper layer portion 531D is larger than that of the lower layer portion 531C. The second layer 531B located at the upper end of the pillow part 531 adjoins the upper layer portion 531B. Thus, as viewed along the thickness direction z, the second layer 531B adjoining the upper layer portion 531D has a larger area than the other second layer 531B adjoining the lower layer portion 531C. The frame surface 531E faces the second electrode 42 of the first semiconductor element 40A. As viewed along the thickness direction z, the frame surface 531E surrounds the entire periphery of the lower layer portion 531C. Though the illustration is omitted, the first layer 531A of the pillow part 531 of each second gate conductor 53B also has a lower layer portion 531C, an upper layer portion 531D and a frame surface 531E. These have the same configurations as the lower layer portion 531C, the upper layer portion 531D and the frame surface 531E of the pillow part 531 of the first gate conductors 53A, so that the description is omitted.

Second Variation of the First Embodiment

A semiconductor device A12, which is the second variation of the semiconductor device A10, is described below based on FIGS. 19-22. The semiconductor device Alt differs from the semiconductor device A10 in configuration of the first detection conductors 52A and the second detection conductors 52B.

Figure 19:
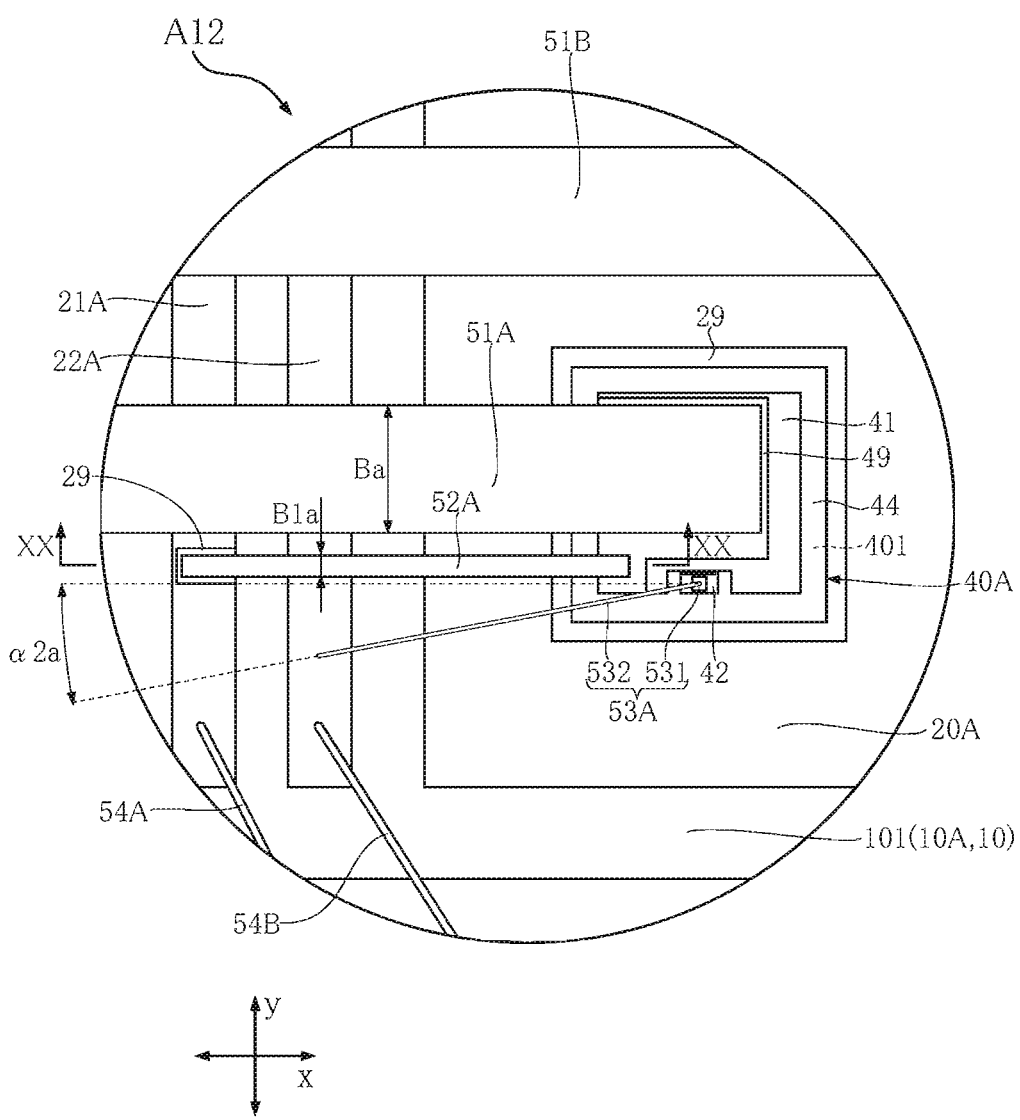
FIG. 19 is a plan view of a part (at or near a first semiconductor element seen through the sealing resin) of a semiconductor device according to a second variation of the first embodiment.
Figure 20:
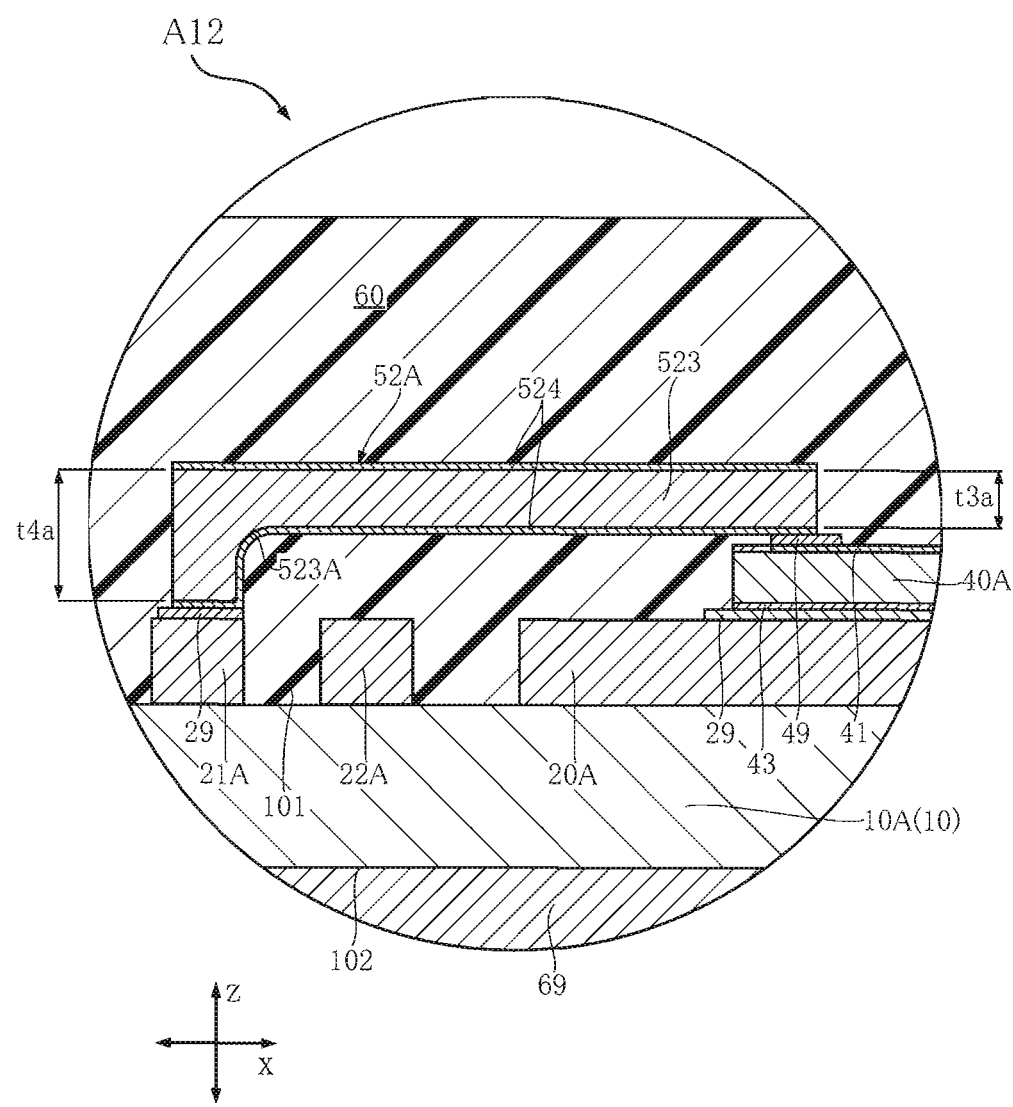
FIG. 20 is a sectional view taken along line XX-XX in FIG. 19.

As shown in FIG. 19, as viewed along the thickness direction z, each of the first detection conductors 52A is in the form of a strip elongated in the first direction x. The width B1$a$ of the first detection conductors 52A is smaller than the width Ba of the first leads 51A. Each first detection conductor 52A is made of an elongated metal piece (metal strip). As shown in FIG. 20, the end of each first detection conductor 52A on the first side in the first direction x is connected to the first electrode 41 of a respective first semiconductor element 40A with a second bonding layer 49. The end of each first detection conductor 52A on the second side in the first direction x is connected to the first detection wiring layer 21A with a first bonding layer 29.

As shown in FIG. 20, each of the first detection conductors 52A has a has a first layer 523 and a pair of second layers 524. The first layer 523 is made of an alloy containing iron and nickel. Examples of the alloy are the same as those for the first layer 521A of the pillow part 521 of the first detection conductor 52A. The paired second layers 524 are made of a metal. Examples of the metal are the same as those for the paired second layers 521B of the pillow part 521 of the first detection conductor 52A. The first layer 523 is sandwiched between the paired second layers 524 in the thickness direction z. In this way, the first detection conductor 52A is a laminate of a plurality of metal layers in the thickness direction z. The ratio of the thickness t3$a$ of the first layer 523 at the end on the first side in the first direction x and the thickness t4$a$ of the first layer 523 at the end on the second side in the first direction x may be t3$a$:t4$a$=1:2, for example. The coefficient of linear expansion of the first detection conductor 52A having such a configuration is in a range of 0 to $8\times10^{-6}$/° C. In contrast, the coefficient of linear expansion of the first conductive layer 20A is about $16\times10^{6}$/° C. Thus, the coefficient of linear expansion of the first detection conductors 52A is smaller than that of the first conductive layer 20A. The first layer 523 of the first detection conductor 52A has a transitional surface 523A. The transitional surface 523A is a curved surface located at the section where the thickness of the first layer 523 changes from the thickness t3$a$ to the thickness t4$a$.

Figure 21:
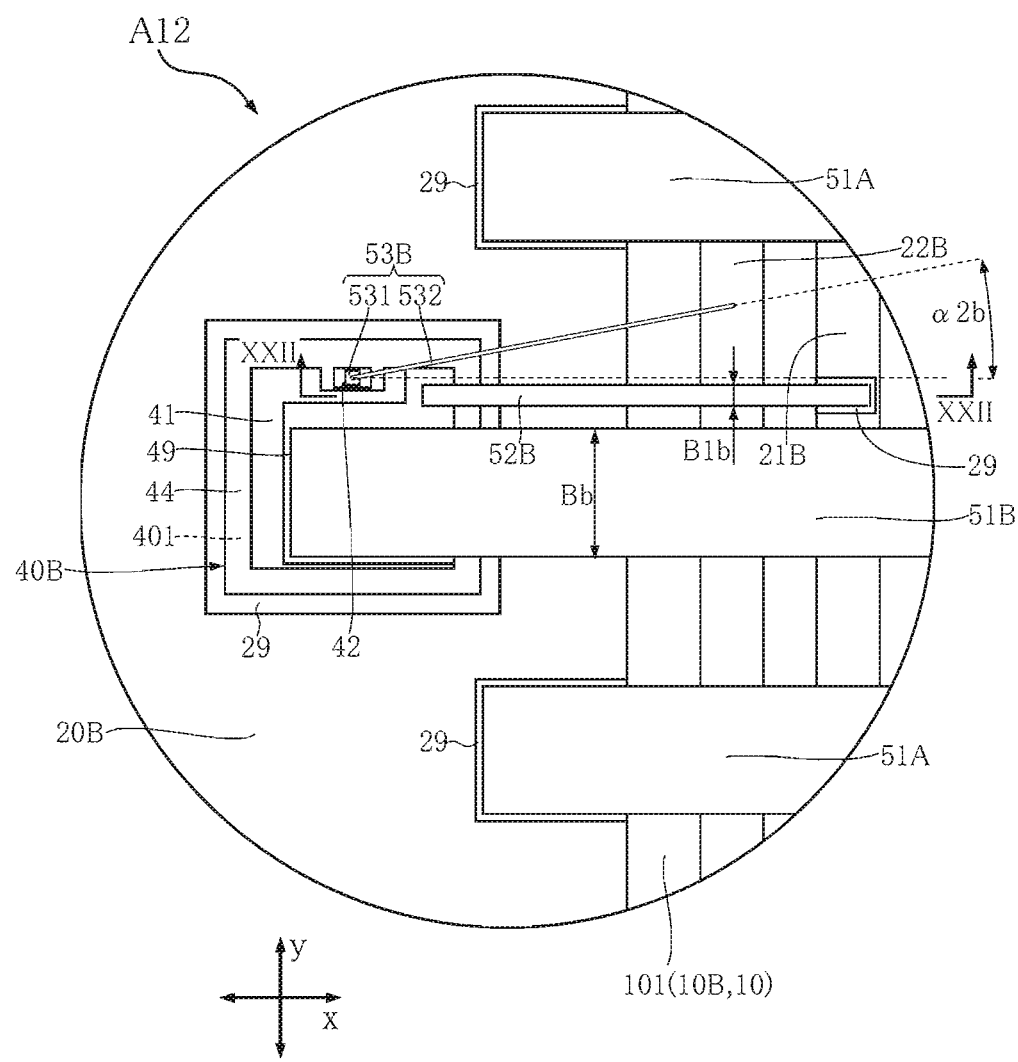
FIG. 21 is a plan view of a part (at or near a second semiconductor element seen through the sealing resin) of the semiconductor device shown in FIG. 19.
Figure 22:
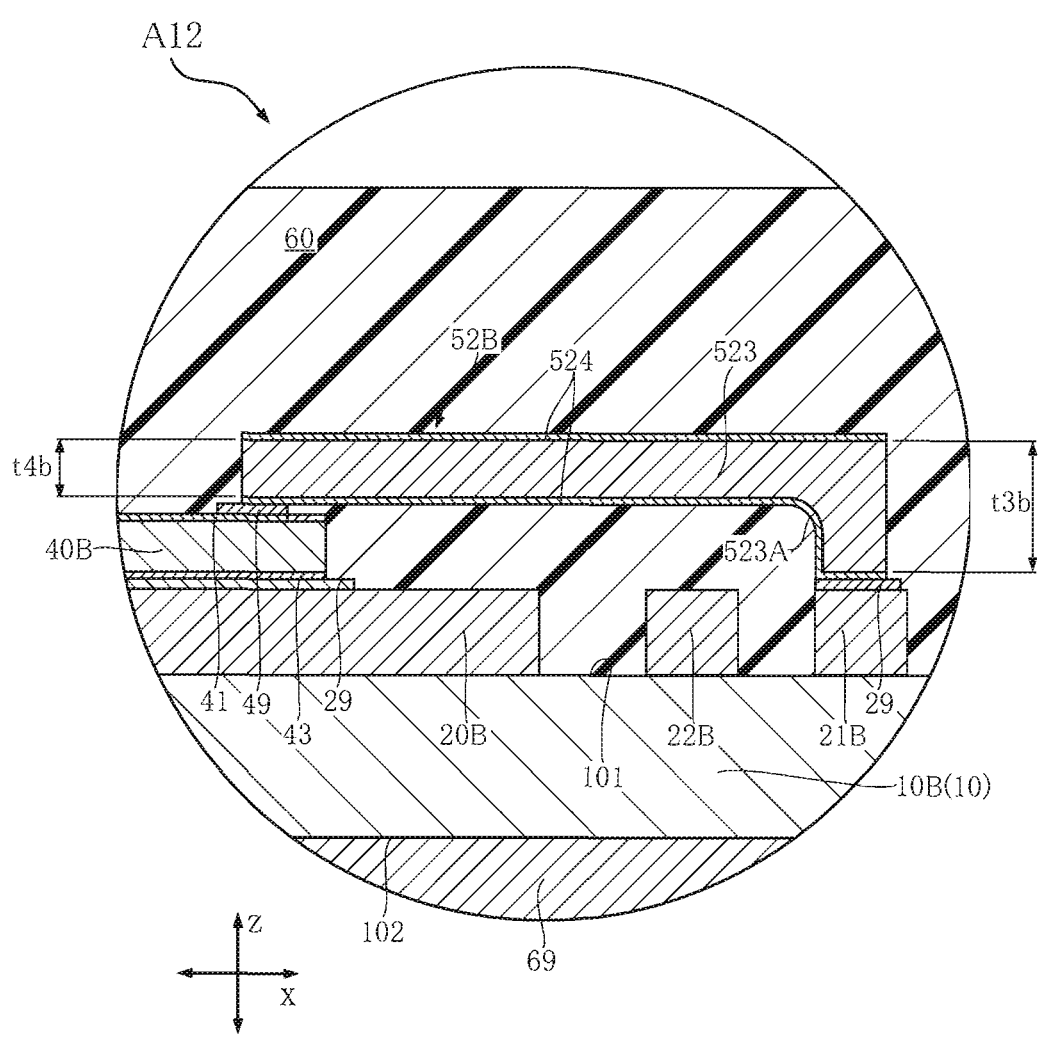
FIG. 22 is a sectional view taken along line XXII-XXII in FIG. 21.

As shown in FIG. 21, as viewed along the thickness direction z, each of the second detection conductors 52B is in the form of a strip elongated in the first direction x. The width B1$b$ of the second detection conductors 52B is smaller than the width Bb of the second leads 51B. Each second detection conductor 52B is made of a metal piece. As shown in FIG. 22, the end of each second detection conductor 52B on the first side in the first direction x is connected to the second detection wiring layer 21B with a first bonding layer 29. The end of each second detection conductor 52B on the second side in the first direction x is connected to the first electrode 41 of a respective second semiconductor element 40B with a second bonding layer 49.

As shown in FIG. 22, each of the second detection conductors 52B has a has a first layer 523 and a pair of second layers 524. The ratio of the thickness t3$b$ of the first layer 523 at the end on the first side in the first direction x and the thickness t4$b$ of the first layer 523 at the end on the second side in the first direction x may be t3$b$:t4$b$=2:1, for example. Other configurations of the first layer 523 and the second layers 524 of each second detection conductor 528 are the same as those of the first layer 523 and the second layers 524 of each first detection conductor 52A, so that the description of such configurations is omitted. Note that the coefficient of linear expansion of the second conductive layer 20B is generally equal to that of the first conductive layer 20A. Thus, the coefficient of linear expansion of the second detection conductor 528 is smaller than that of the second conductive layer 20B. The first layer 523 of the second detection conductor 528 has a transitional surface 523A. The transitional surface 523A is a curved surface located at the section where the thickness of the first layer 523 changes from the thickness t3$b$ to the thickness t4$b$.

Third Variation of the First Embodiment

A semiconductor device A13, which is the third variation of the semiconductor device A10, is described below based on FIGS. 23-26. The semiconductor device A13 differs from the semiconductor device A10 in configuration of the first detection conductors 52A, the second detection conductors 52B, the first gate conductors 53A and the second gate conductors 53B. Of these conductors, the first detection conductors 52A and the second detection conductor 52B have the same configurations as those in the semiconductor device A12 described before, so that the description is omitted.

Figure 23:
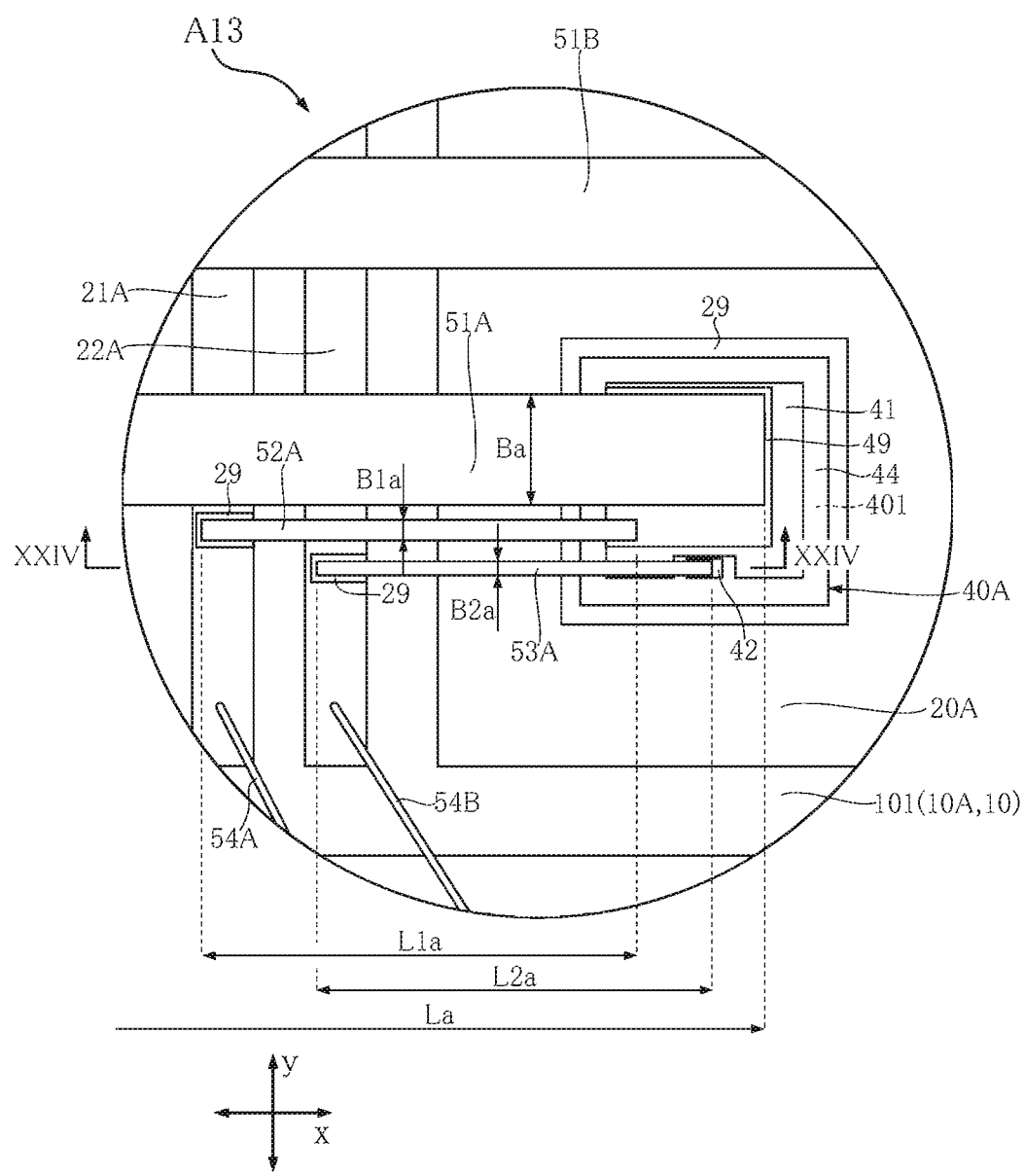
FIG. 23 is a plan view of a part (at or near a first semiconductor element seen through the sealing resin) of a semiconductor device according to a third variation of the first embodiment.
Figure 24:
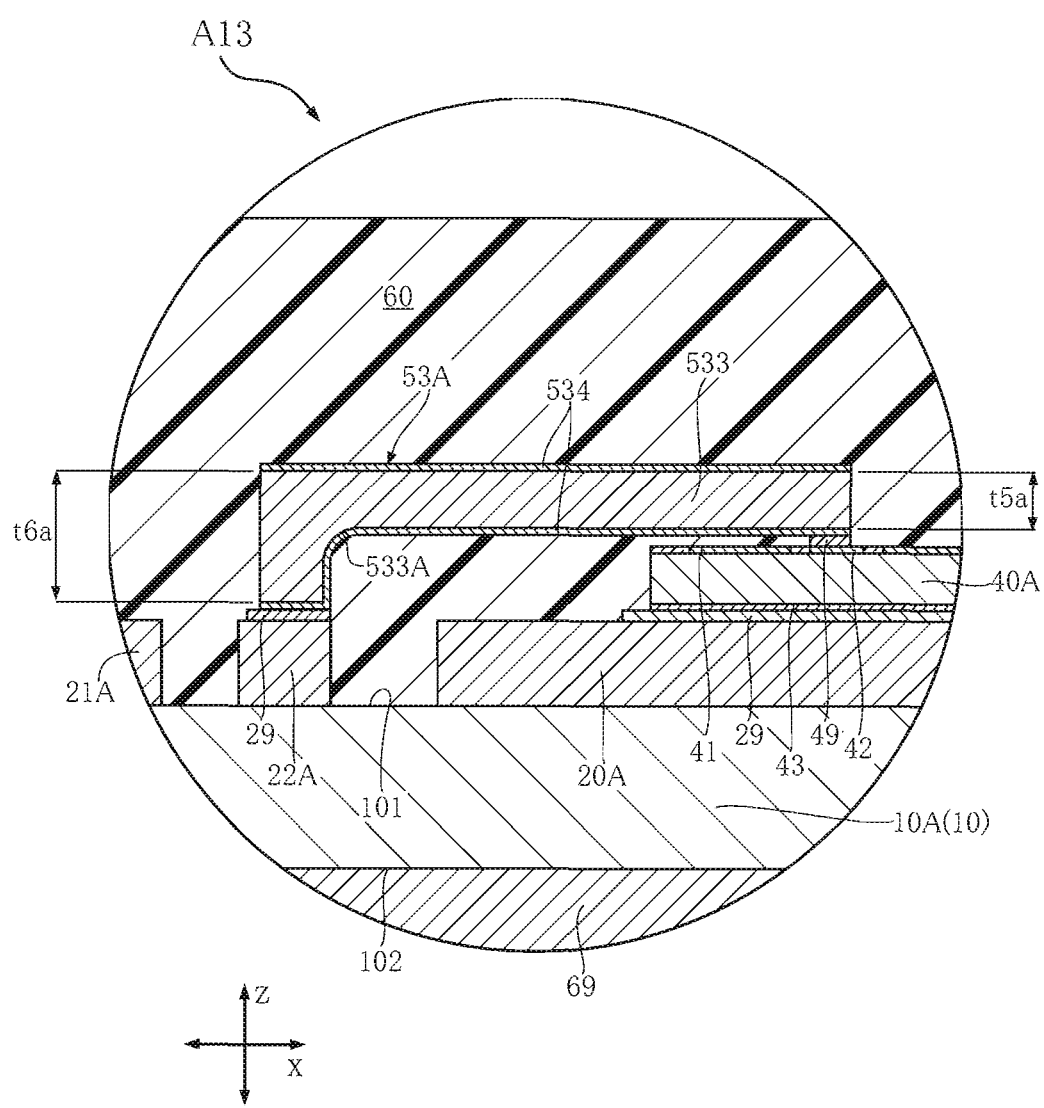
FIG. 24 is a sectional view taken along line XXIV-XXIV in FIG. 23.

As shown in FIG. 23, as viewed along the thickness direction z, each of the first gate conductors 53A is in the form of a strip elongated in the first direction x. The width B2$a$ of the first gate conductors 53A is smaller than the width Ba of the first leads 51A. Each first gate conductor 53A is made of a metal piece. As shown in FIG. 24, the end of each first gate conductor 53A on the first side in the first direction x is connected to the second electrode 42 of a respective first semiconductor element 40A with a second bonding layer 49. The end of each first gate conductor 53A on the second side in the first direction x is connected to the first gate wiring layer 22A with a first bonding layer 29.

As shown in FIG. 24, each of the first gate conductors 53A has a has a first layer 533 and a pair of second layers 534. The first layer 533 is made of an alloy containing iron and nickel. Examples of the alloy are the same as those for the first layer 521A of the pillow part 521 of the first detection conductor 52A. The paired second layers 534 are made of a metal. Examples of the metal are the same as those for the paired second layers 521B of the pillow part 521 of the first detection conductor 52A. The first layer 533 is sandwiched between the paired second layers 534 in the thickness direction z. In this way, the first gate conductor 53A is a laminate of a plurality of metal layers in the thickness direction z. The ratio of the thickness t5a of the first layer 533 at the end on the first side in the first direction x and the thickness t6a of the first layer 533 at the end on the second side in the first direction x may be t5a:t6a=1:2, for example. The coefficient of linear expansion of the first gate conductor 53A having such a configuration is in a range of 0 to $8 \times 10^{-6}/°$ C. In contrast, the coefficient of linear expansion of the first conductive layer 20A is about $16 \times 10^{-6}/°$ C. Thus, the coefficient of linear expansion of the first gate conductors 53A is smaller than that of the first conductive layer 20A. The first layer 533 of the first gate conductor 53A has a transitional surface 533A. The transitional surface 533A is a curved surface located at the section where the thickness of the first layer 533 changes from the thickness t5a to the thickness t6a.

Figure 25:
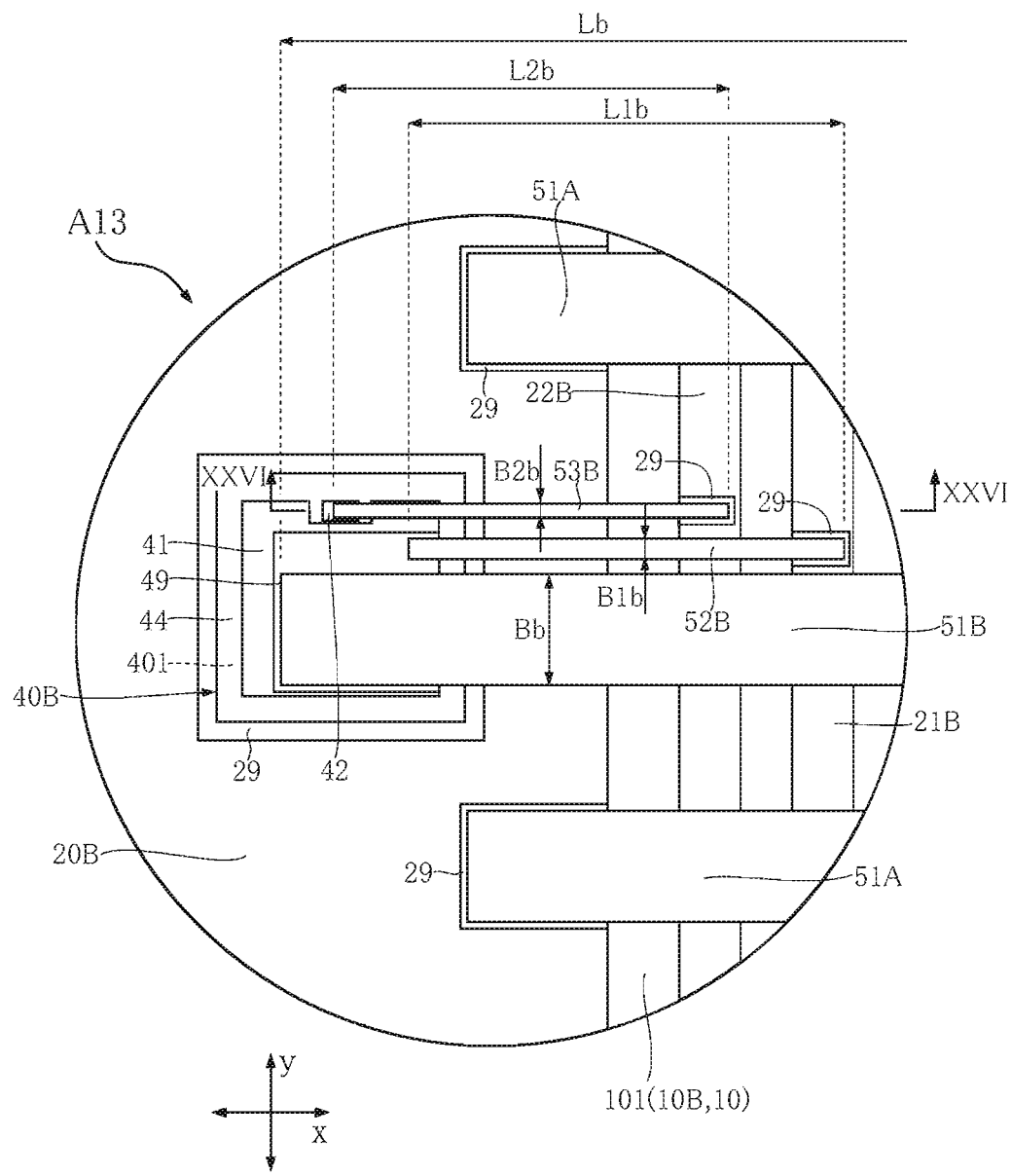
FIG. 25 is a plan view of a part (at or near a second semiconductor element seen through the sealing resin) of the semiconductor device shown in FIG. 23.
Figure 26:
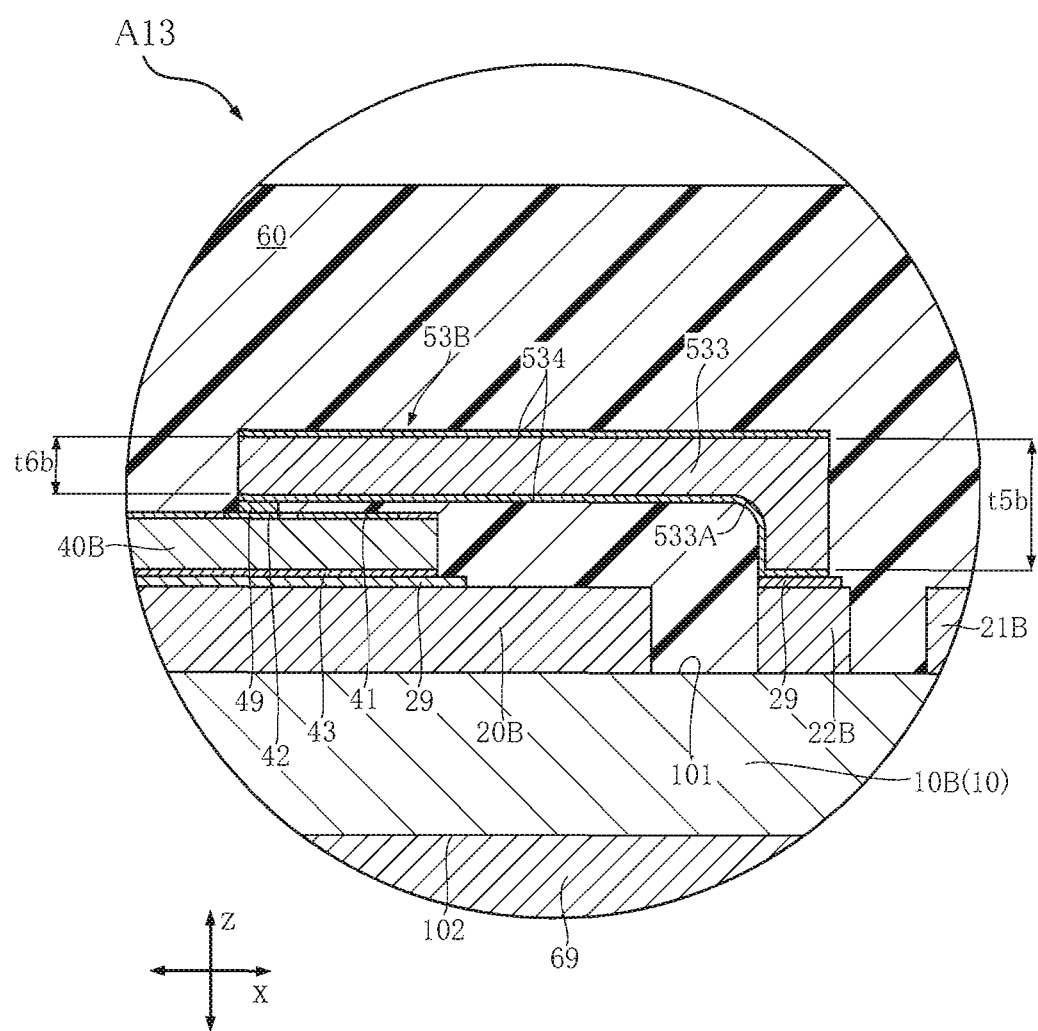
FIG. 26 is a sectional view taken along line XXVI-XXVI in FIG. 25.

As shown in FIG. 25, as viewed along the thickness direction z, each of the second gate conductors 533 is in the form of a strip elongated in the first direction x. The width 32b of the second gate conductors 533 is smaller than the width Bb of the second leads 51B. Each second gate conductor 53B is made of a metal piece. As shown in FIG. 26, the end of each second gate conductor 53B on the first side in the first direction x is connected to the second gate wiring layer 22B with a first bonding layer 29. The end of each second gate conductor 53B on the second side in the first direction x is connected to the second electrode 42 of a respective second semiconductor element 403 with a second bonding layer 49.

As shown in FIG. 26, each of the second gate conductors 533 has a first layer 533 and a pair of second layers 534. The ratio of the thickness t5b of the first layer 533 at the end on the first side in the first direction x and the thickness t6b of the first layer 533 at the end on the second side in the first direction x may be t5b:t6b=2:1, for example. Other configurations of the first layer 533 and the second layers 534 of each second gate conductor 53B are the same as those of the first layer 533 and the second layers 534 of each first gate conductor 53A, so that the description of such configurations is omitted. Note that the coefficient of linear expansion of the second conductive layer 20B is generally equal to that of the first conductive layer 20A. Thus, the coefficient of linear expansion of the second gate conductor 53B is smaller than that of the second conductive layer 20B. The first layer 533 of the second gate conductor 53B has a transitional surface 533A. The transitional surface 533A is a curved surface located at the section where the thickness of the first layer 533 changes from the thickness t5b to the thickness t6b.

The advantages of the semiconductor device A10 are described below.

The semiconductor device A10 includes the first semiconductor elements 40A each having a first electrode 41 and a second electrode 42 and bonded for electrical connection to the first conductive layer 20A, the first leads 51A connected to the first electrodes 41 and the second conductive layer 20B, the first detection conductors 52A, and the second detection conductors 52B. The first detection conductors 52A are connected to the first electrodes 41. The first gate conductors 53A are connected to the second electrodes 42. In at least either of the first detection conductors 52A and the first gate conductors 53A, the ends connected to the first semiconductor elements 40A have a coefficient of linear expansion smaller than that of the first conductive layer 20A. Such an arrangement reduces at least either of the thermal stress generated between the first electrodes 41 and the first detection conductors 52A and the thermal stress generated between the second electrodes and the first gate conductors 53A. As a result, the possibility of detachment from the first semiconductor elements 40A is reduced in at least either of the first detection conductors 52A and the first gate conductors 53A, which assures the reliability of the semiconductor device A10.

In the semiconductor device A10, the first detection conductors 52A and the first gate conductors 53A have pillow parts 521, 531 connected to the first semiconductor elements 40A and wire parts 522, 532 connected to the pillow parts 521, 531. The coefficient of linear expansion of the pillow parts 521, 531 is smaller than that of the first conductive layer 20A. With such an arrangement, the first detection conductors 52A and the first gate conductors 53A have, at their ends connected to the first semiconductor elements 40A, a coefficient of linear expansion smaller than the first conductive layer 20A.

Each pillow part 521, 531 has a first layer 521A, 531A made of an alloy containing iron and nickel and a pair of second layers 521B, 531B made of a metal different from the first layer 521A, 531A. The first layer 521A, 531A is sandwiched between the paired second layers 521B, 531B in the thickness direction z. With such an arrangement, the coefficient of linear expansion of the pillow parts 521, 531 can be made smaller than that of the first conductive layer 20A. Also, such an arrangement allows for reliable connection of the pillow parts 521, 531 to both of the first semiconductor elements 40A and the wire parts 522, 532.

The first layers 521A, 531A of the pillow parts 521, 531 can be made of a semiconductor material, instead of an alloy containing iron and nickel. In such a case, the coefficient of linear expansion of the pillow parts 521, 531 becomes closer to that of the first semiconductor element 40A. This allows for more effective reduction of at least either of the thermal stress generated between the first electrodes 41 and the first detection conductors 52A and the thermal stress generated between the second electrodes 42 and the first gate conductors 53A.

In the semiconductor device A11, the first layer 521A, 531A of each pillow part 521, 531 has a lower layer portion 521C, 531C and an upper layer portion 521D, 531D. As viewed along the thickness direction z, the area of the upper layer portion 521D, 531D is larger than that of the lower layer portion 521C, 531C. With such an arrangement, the pillow part 521, 531 has a relatively large area for connecting the wire part 522, 532, which makes easier the connection of the wire part 522, 532 to the pillow part 521, 531.

In the semiconductor device A12, each first detection conductor 52A is made of a metal piece. The coefficient of linear expansion of the first detection conductors 52A is smaller than that of the first conductive layer 20A. With such an arrangement, the first detection conductors 52A have, at their ends connected to the first semiconductor elements 40A, a coefficient of linear expansion smaller than the first conductive layer 20A.

Each of the first detection conductors 52A of the semiconductor device A12 has a first layer 523 made of an alloy containing iron and nickel and a pair of second layers 524 made of a metal different from the first layer 523. The first layer 523 is sandwiched between the paired second layers 524 in the thickness direction z. With such an arrangement, the coefficient of linear expansion of the first detection conductors 52A can be made smaller than that of the first conductive layer 20A. Also, such an arrangement allows for reliable connection of the first detection conductors 52A to both of the first semiconductor elements 40A and the first detection wiring layer 21A.

In the semiconductor device A10, the first detection wiring layer 21A and the first gate wiring layer 22A are formed on the front surface 101 of the insulating support member 10. Such an insulating support member 10, formed with the first conductive layer 20A, the first detection wiring layer 21A and the first gate wiring layer 22A on the front surface 101, can be easily made by using a DBC (trademark) substrate.

The semiconductor device A10 further includes the second semiconductor elements 40B each having a first electrode 41 and a second electrode 42 and bonded for electrical connection to the second conductive layer 20B, the second leads 51B connected to the first electrodes 41 of the second semiconductor elements 40B, the second detection conductors 52B and the second gate conductors 53B. The second detection conductors 52B are connected to the first electrodes 41 of the second semiconductor elements 40B. The second gate conductors 53B are connected to the second electrodes 42 of the second semiconductor elements 40B. In at least either of the second detection conductors 52B and the second gate conductors 53B, the ends connected to the second semiconductor elements 40B have a coefficient of linear expansion smaller than that of the second conductive layer 20B. Such an arrangement reduces at least either of the thermal stress generated between the first electrodes 41 of the second semiconductor elements 40B and the second detection conductor 52B and the thermal stress generated between the second electrodes 42 of the second semiconductor elements 40B and the second gate conductors 53B. As a result, the possibility of detachment from the second semiconductor elements 40B is reduced in at least either of the second detection conductors 52B and the second gate conductors 533.

The semiconductor device A10 further includes the first input terminal 31 and the second input terminal 32. The first input terminal 31 is electrically connected to the first conductive layer 20A. The second input terminal 32 is electrically connected to the second leads 51B. The second leads 51B are connected to the second input terminal 32. Thus, the second input terminal 32 and the second leads 51B can be formed as an integral part, which reduces the number of parts of the semiconductor device A10.

The first input terminal 31 and the second input terminal 32 are located on the first side in the first direction x. The first input terminal 31 and the second input terminal 32 are spaced apart from each other in the thickness direction z. As viewed along the thickness direction z, part of the second input terminal 32 (the second terminal part 322) overlaps with the first input terminal 31. With such an arrangement, during the use of the semiconductor device A10, the magnetic field generated from the second input terminal 32 reduces the inductance of the first input terminal 31.

Second Embodiment

Figure 27:
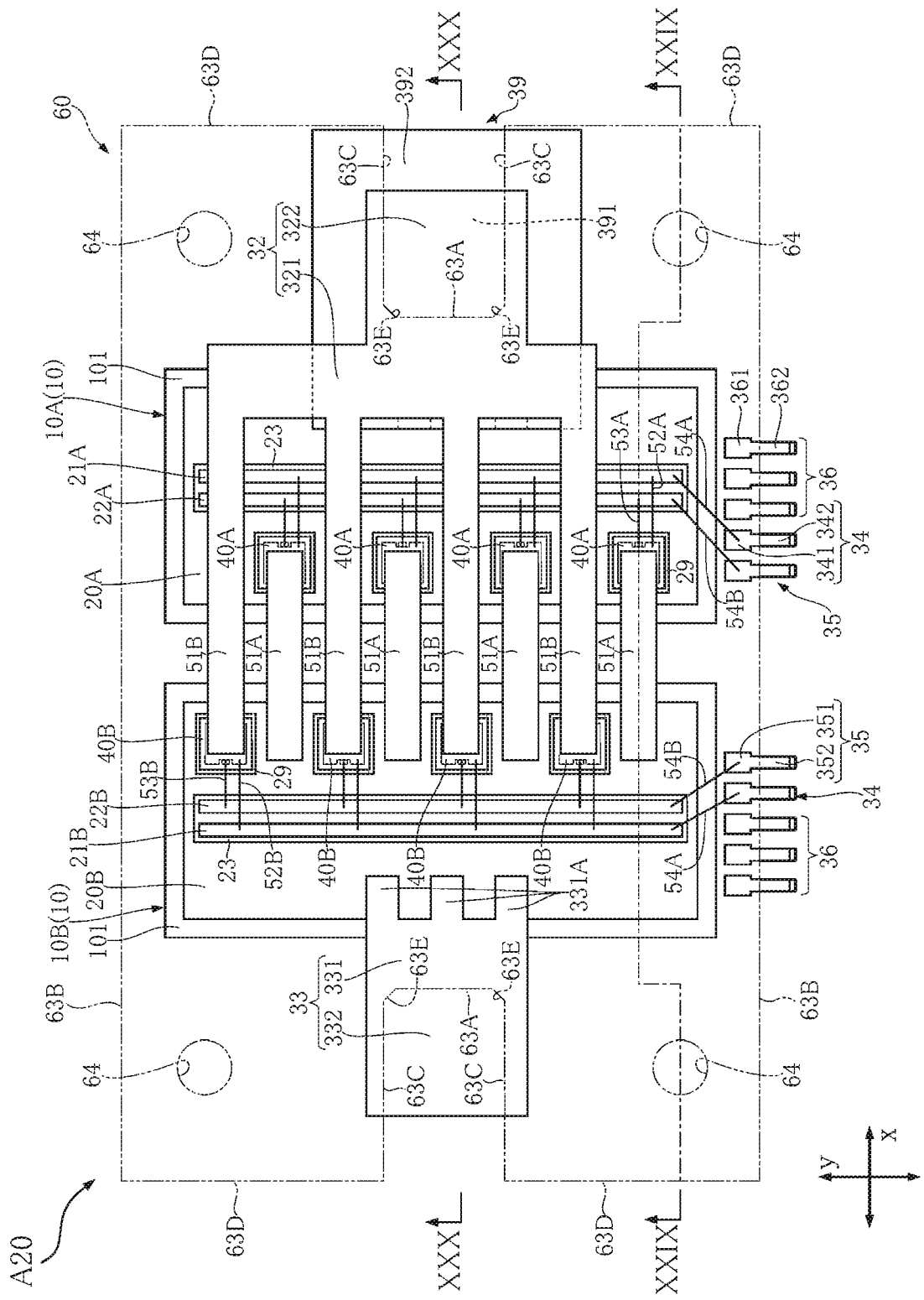
FIG. 27 is a plan view (seen through the sealing resin) of a semiconductor device according to a second embodiment.

A semiconductor device A20 according to a second embodiment is described below based on FIGS. 27-32. In these figures, the elements that are identical or similar to those of the semiconductor device A10 are denoted by the same reference signs as those used for the semiconductor device A10 and are not described. In FIG. 27, the sealing resin 60 is illustrated as transparent for the convenience of understanding. Thus, the sealing resin 60 are indicated by imaginary lines (two-dot chain lines).

The semiconductor device A20 differs from the semiconductor device A10 in that the semiconductor device A20 is provided with a pair of insulating layers 23 and does not include a metal substrate 69. The semiconductor device A20 differs from the semiconductor device A10 also in configurations of the first detection wiring layer 21A, the second detection wiring layer 21B, the first gate wiring layer 22A, the second gate wiring layer 22B, the first semiconductor elements 40A, the second semiconductor elements 40B, the first leads 51A and the second leads 51B.

Figure 29:
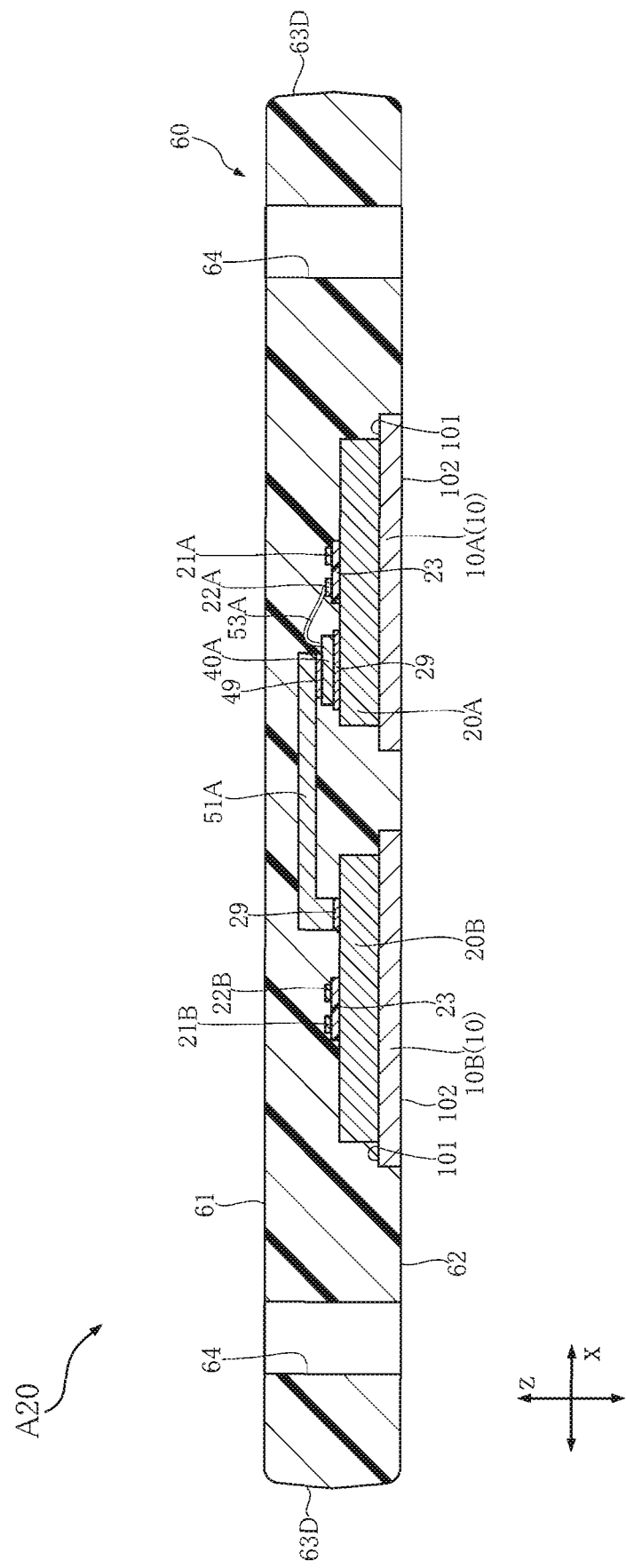
FIG. 29 is a sectional view taken along line XXIX-XXIX in FIG. 27.
Figure 30:
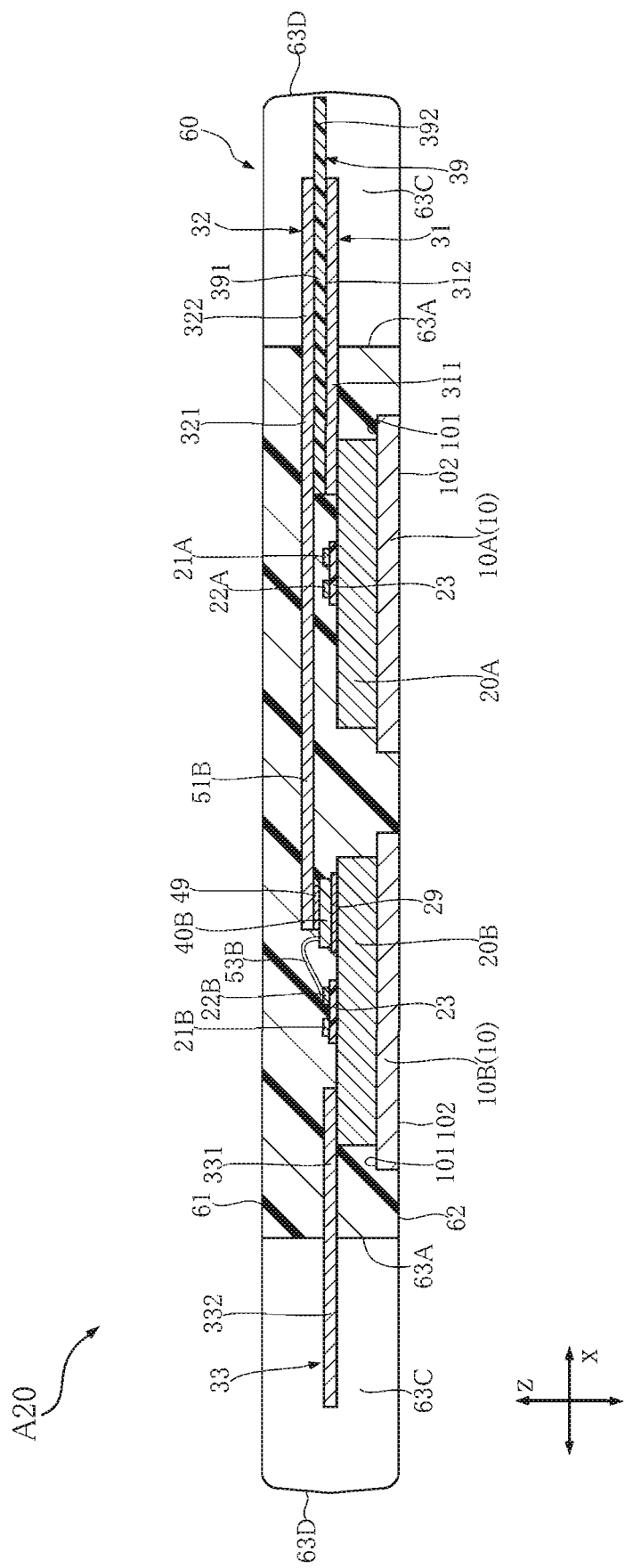
FIG. 30 is a sectional view taken along line XXX-XXX in FIG. 27.

As shown in FIGS. 27, 29 and 30, the paired insulating layers 23 are arranged on the first conductive layer 20A and the second conductive layer 20B. The insulating layers 23 are spaced apart from each other in the first direction x. Each of the insulating layers 23 is in the form of a strip elongated in the second direction y. The insulating layer 23 that is offset toward the first side in the first direction x is on the first conductive layer 20A. The insulating layer 23 that is offset toward the second side in the first direction x is on the second conductive layer 20B. The insulating layers 23 may be made of glass epoxy resin, for example.

As shown in FIGS. 27, 29 and 30, the first detection wiring layer 21A and the first gate wiring layer 22A are arranged on one of the insulating layers 23 that is on the first conductive layer 20A. The second detection wiring layer 21B and the second gate wiring layer 22B are arranged on the other one of the insulating layers 23 that is on the second conductive layer 20B. Thus, in the semiconductor device A20 again, as viewed along the thickness direction z, the first detection wiring layer 21A, the second detection wiring layer 21B, the first gate wiring layer 22A and the second gate wiring layer 22B overlap with the front surface 101 of the insulating support member 10.

As shown in FIGS. 27 and 29, the first semiconductor elements 40A are offset toward the second side in the first direction x from the one of the insulating layers 23 that is on the first conductive layer 20A. In each of the first semiconductor elements 40A, the second electrode 42 is offset toward the first side in the first direction x.

As shown in FIGS. 27 and 30, the second semiconductor elements 40B are offset toward the first side in the first direction x from the other one of the insulating layers 23 that is on the second conductive layer 20B. In each of the second semiconductor elements 40B, the second electrode 42 is offset toward the second side in the first direction x.

As shown in FIG. 27, the dimension of each first lead 51A in the first direction x is smaller than that in the semiconductor device A10. Also, the dimension of each second lead 51B in the first direction x is smaller than that in the semiconductor device A10.

Figure 28:
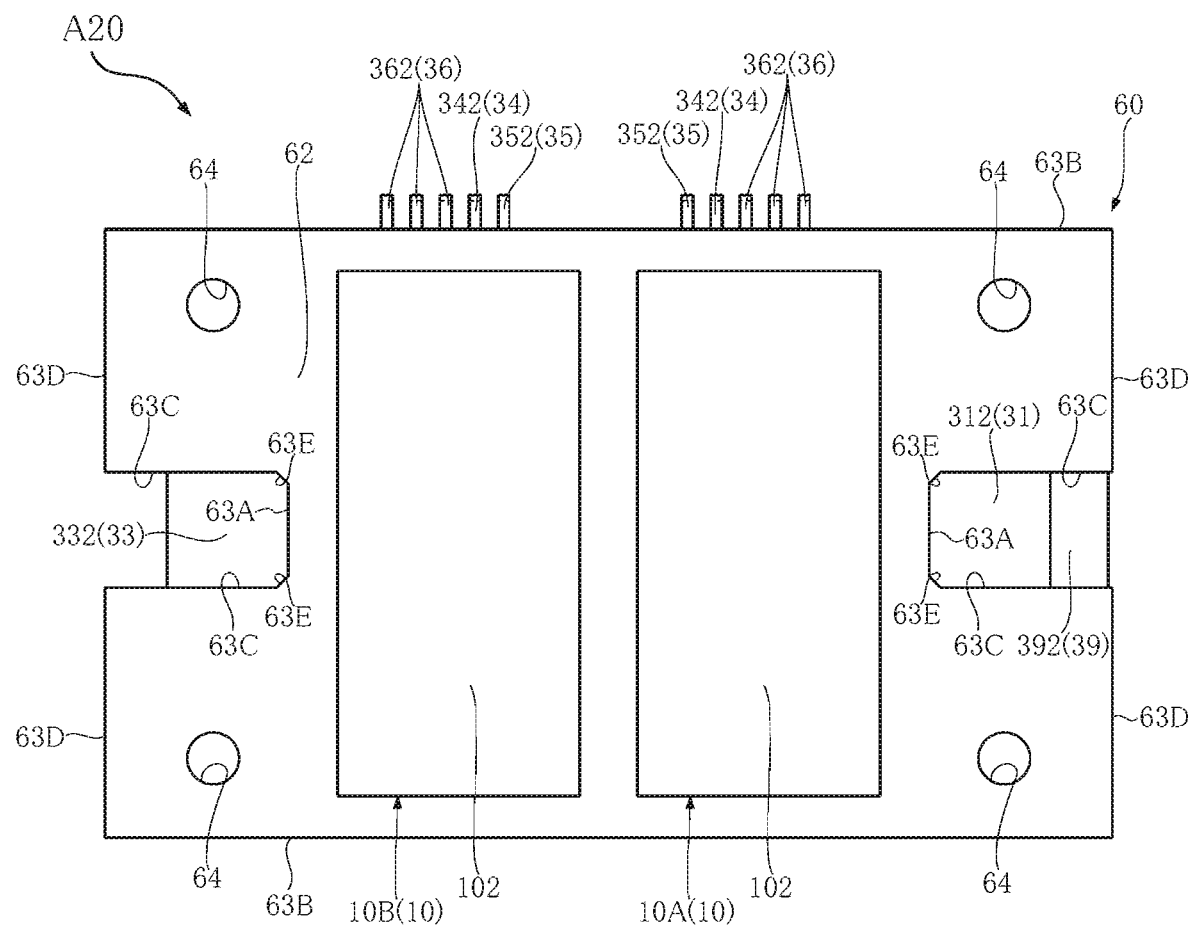
FIG. 28 is a bottom view of the semiconductor device shown in FIG. 27.

As shown in FIGS. 27 and 28, a pair of detection terminals 34 takes the place of the pair of gate terminals 35 of the semiconductor device A10. Also, a pair of gate terminals 35 takes the place of the pair of detection terminal 34 of the semiconductor device A10. As shown in FIG. 28, the back surface 102 of the insulating support member 10 is exposed from the bottom surface 62 of the sealing resin 60.

Figure 31:
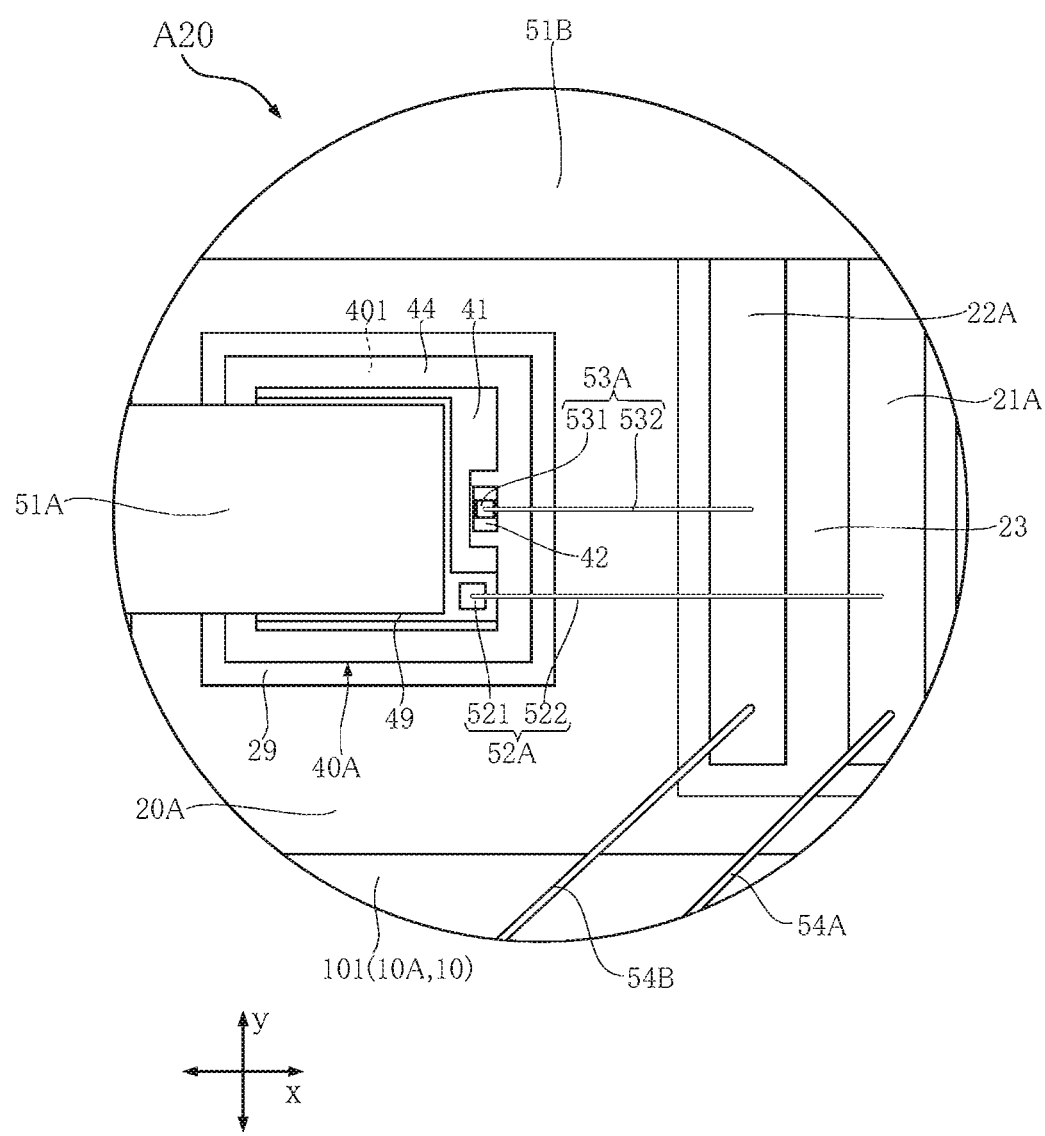
FIG. 31 is a view showing a part (at or near a first semiconductor element) of FIG. 27.
Figure 32:
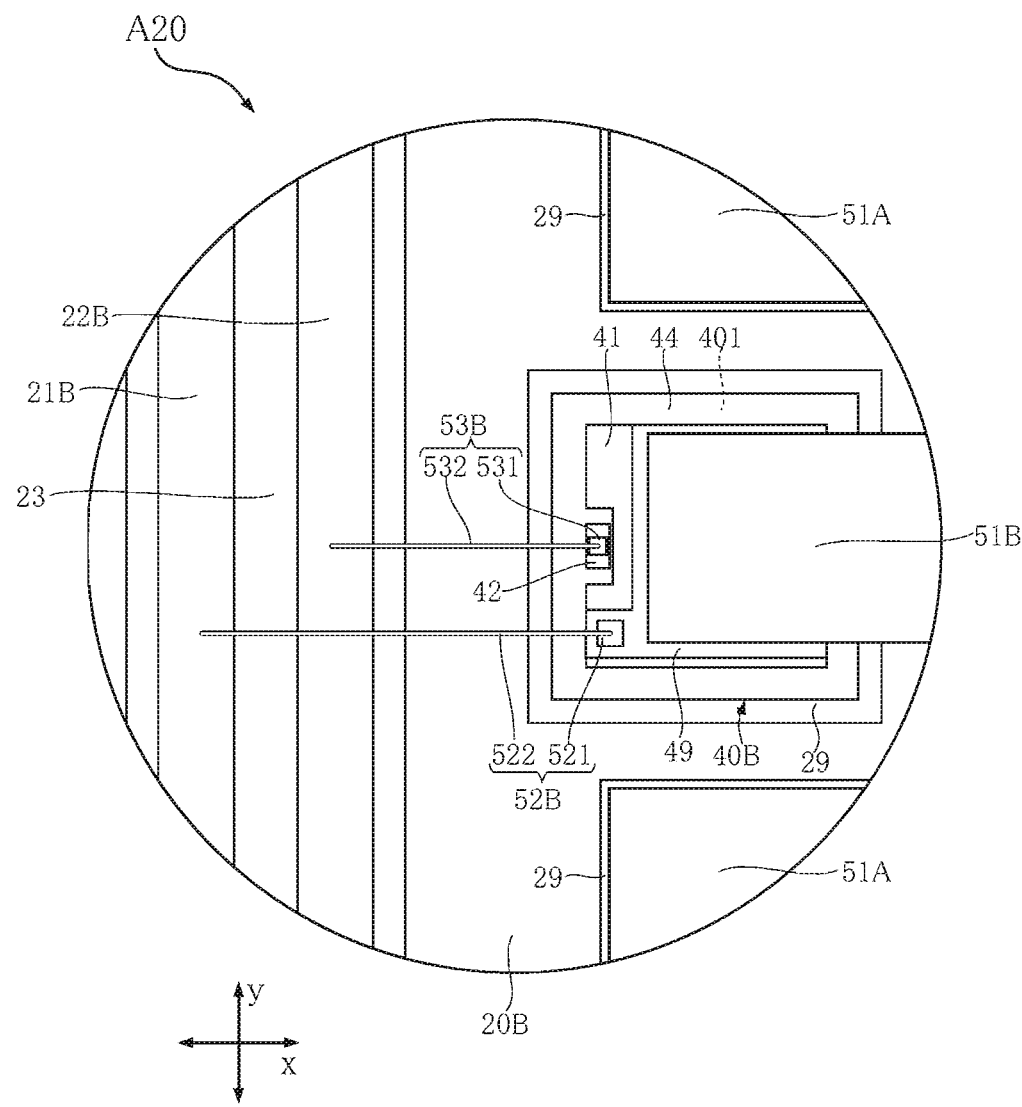
FIG. 32 is a view showing a part (at or near a second semiconductor element) of FIG. 27.

As shown in FIG. 31, as viewed along the thickness direction z, the first detection conductors 52A and the first gate conductors 53A extend from the first semiconductor elements 40A toward the first side in the first direction x. As shown in FIG. 32, as viewed along the thickness direction z, the second detection conductors 52B and the second gate conductors 53B extend from the second semiconductor elements 40B toward the second side in the first direction x. Other configurations of each of the first detection conductors 52A, the second detection conductors 52B, the first gate conductors 53A and the second gate conductors 53B are the same as those in the semiconductor device A10, so that the description of such configurations is omitted.

First Variation of the Second Embodiment

A semiconductor device A21, which is the first variation of the semiconductor device A20, is described below based on FIGS. 33 and 34. The semiconductor device A21 differs from the semiconductor device A20 in configuration of the first detection conductors 52A and the second detection conductors 52B.

Figure 33:
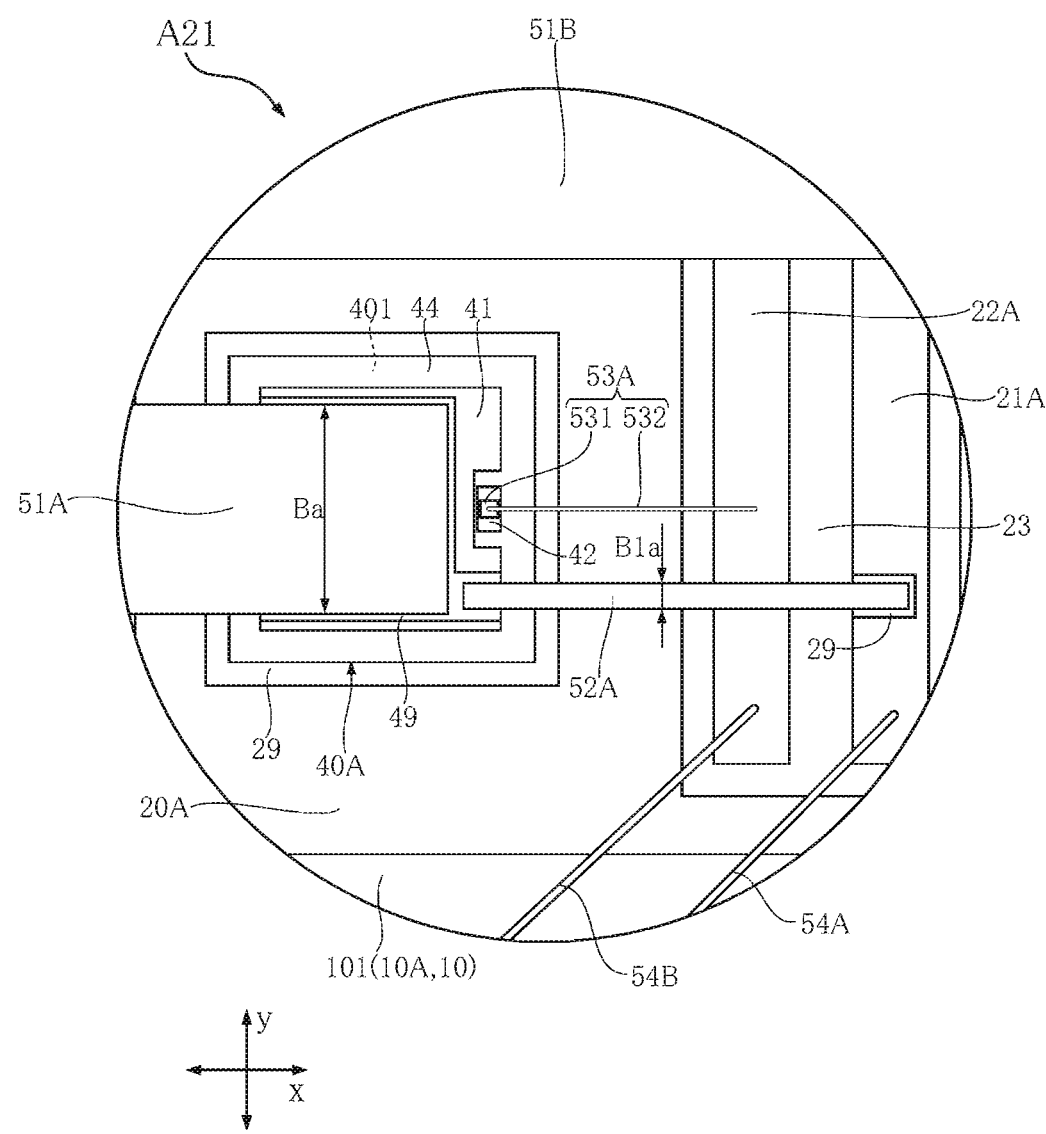
FIG. 33 is a plan view of a part (at or near a first semiconductor element seen through the sealing resin) of a semiconductor device according to a first variation of the second embodiment.

As shown in FIG. 33, as viewed along the thickness direction z, each of the first detection conductors 52A is in the form of a strip extending from the first semiconductor element 40A toward the first side in the first direction x. The width B1a of the first detection conductors 52A is smaller than the width Ba of the first leads 51A. Each first detection conductors 52A is made of a metal piece. Other configurations of the first detection conductors 52A are the same as those of the first detection conductors 52A of the semiconductor device A12, so that the description is omitted.

Figure 34:
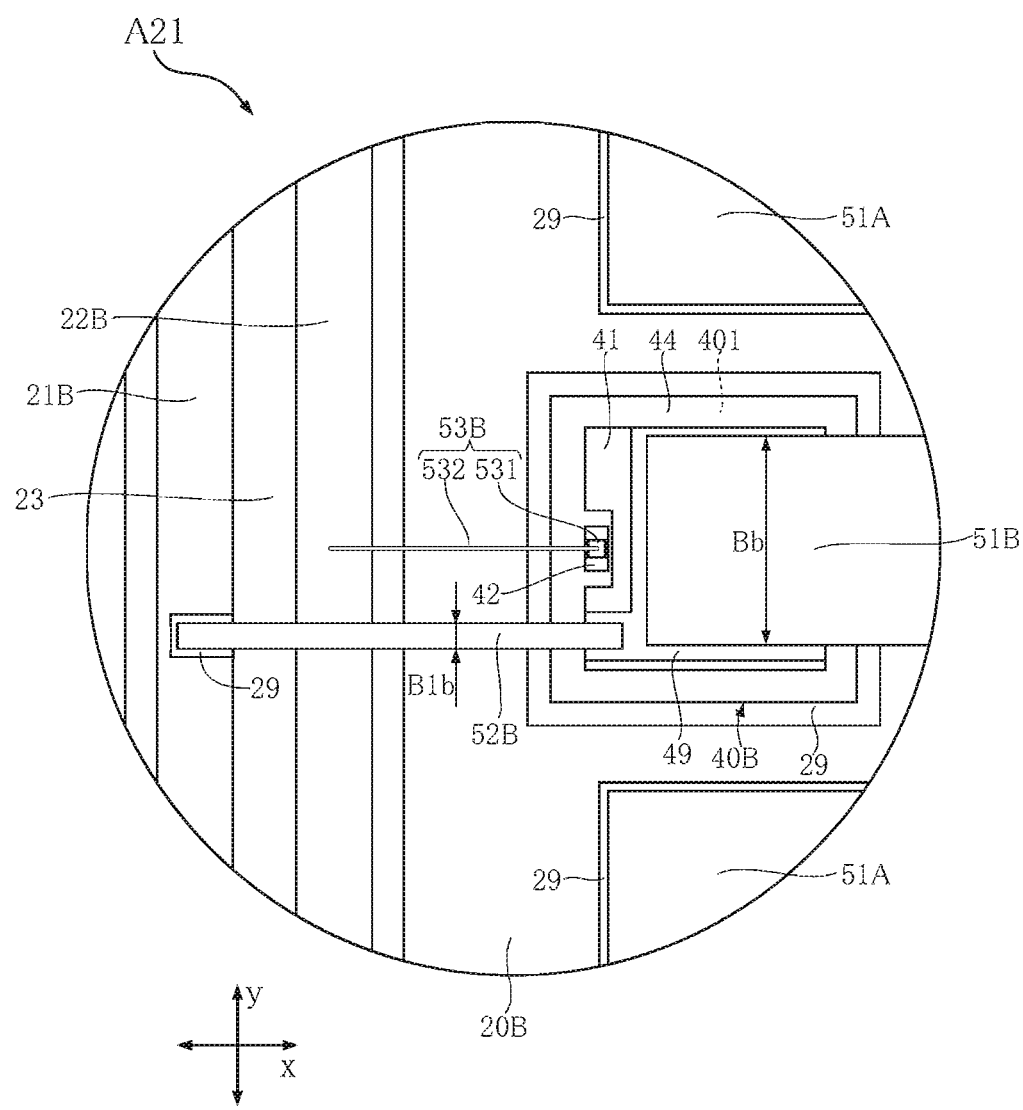
FIG. 34 is a plan view of a part (at or near a second semiconductor element seen through the sealing resin) of the semiconductor device shown in FIG. 33.

As shown in FIG. 34, as viewed along the thickness direction z, each of the second detection conductors 52B is in the form of a strip extending from the second semiconductor element 40B toward the second side in the first direction x. The width B1b of the second detection conductors 52B is smaller than the width Bb of the second leads 51B. Each second detection conductor 52B is made of a metal piece. Other configurations of the second detection conductors 52B are the same as those of the second detection conductors 52B of the semiconductor device A12, so that the description is omitted.

Second Variation of the Second Embodiment

A semiconductor device A22, which is the second variation of the semiconductor device A20, is described below based on FIGS. 35 and 36. The semiconductor device A22 differs from the semiconductor device A20 in configuration of the first detection conductors 52A, the second detection conductors 52B, the first gate conductors 53A and the second gate conductors 53B. Of these conductors, the first detection conductors 52A and the second detection conductors 52B have the same configurations as those of the semiconductor device A21, so that the description is omitted.

Figure 35:
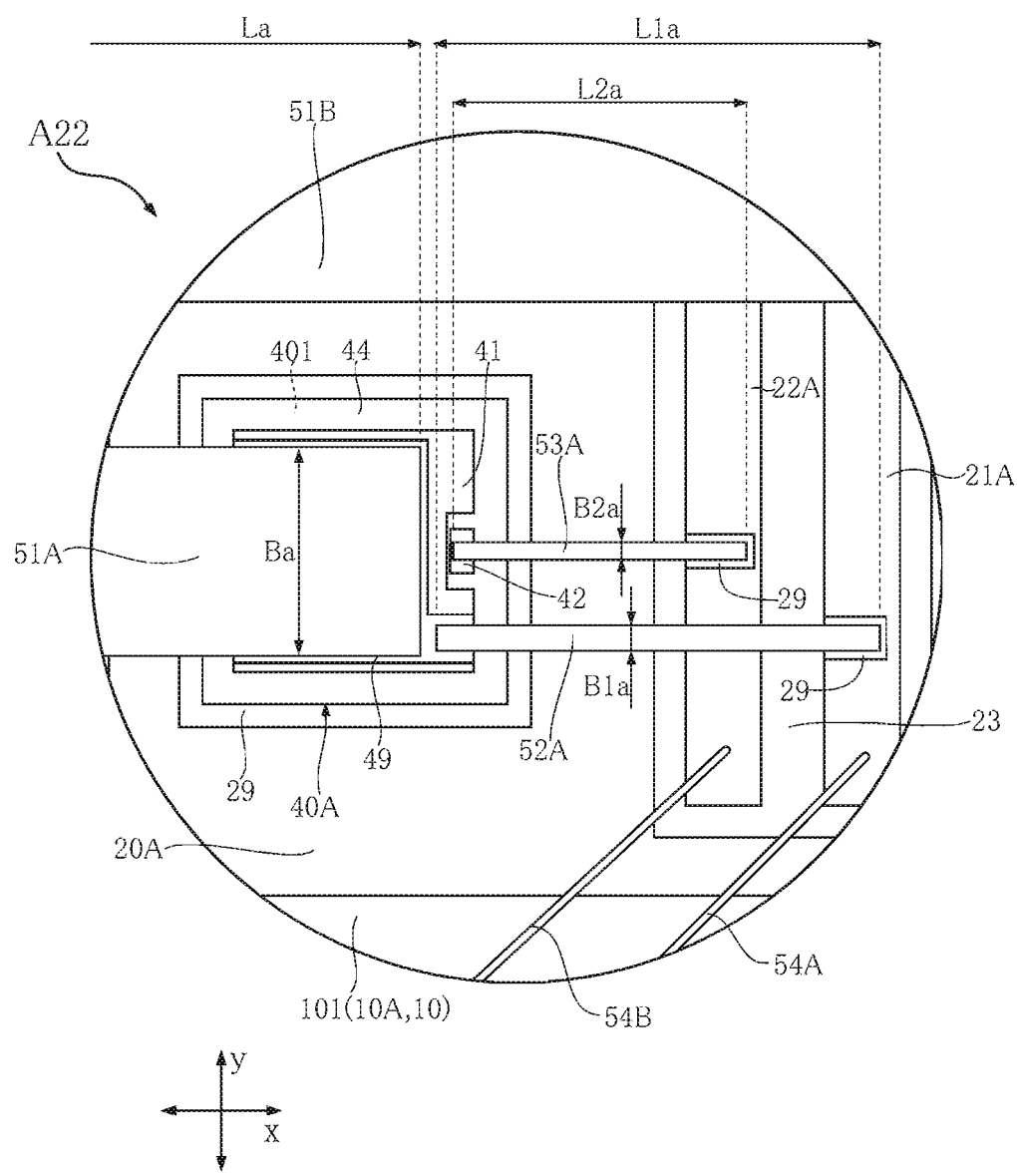
FIG. 35 is a plan view of a part (at or near a first semiconductor element seen through the sealing resin) of a semiconductor device according to a second variation of the second embodiment.

As shown in FIG. 35, as viewed along the thickness direction z, each of the first gate conductors 53A is in the form of a strip extending from the first semiconductor element 40A toward the first side in the first direction x. The width B1a of the first gate conductors 53A is smaller than the width Ba of the first leads 51A. The length L2a of the first gate conductors 53A is smaller than the length L1a of the first detection conductors 52A. Each first gate conductor 53A is made of a metal piece. Other configurations of the first gate conductors 53A are the same as those of the first gate conductors 53A of the semiconductor device A13, the description is omitted.

Figure 36:
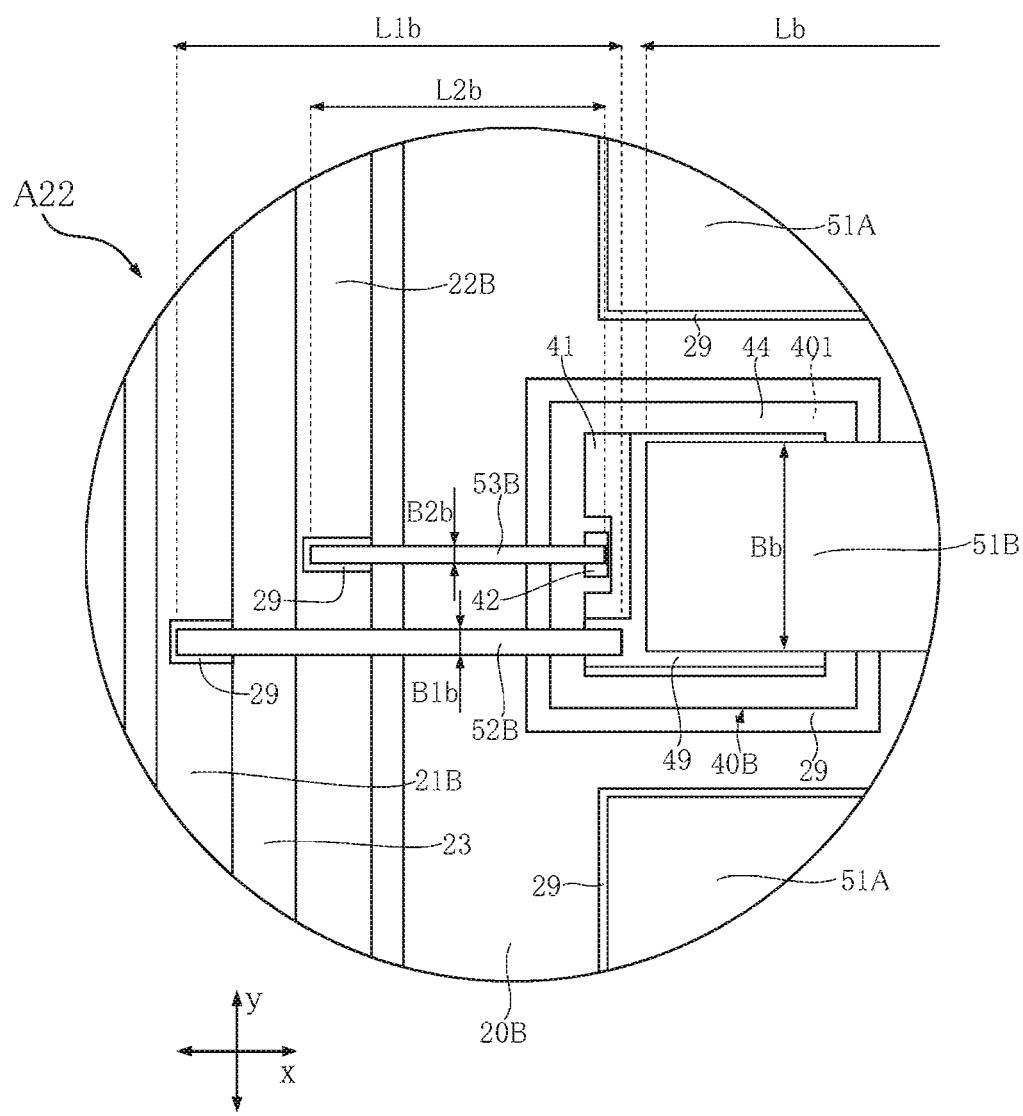
FIG. 36 is a plan view of a part (at or near a second semiconductor element seen through the sealing resin) of the semiconductor device shown in FIG. 35.

As shown in FIG. 36, as viewed along the thickness direction z, each of the second gate conductors 53B is in the form of a strip extending from the second semiconductor element 40B toward the second side in the first direction x. The width 32b of the second gate conductors 53B is smaller than the width Bb of the second leads 51B. The length L2b of the second gate conductors 53B is smaller than the length L1b of the second detection conductors 52B. Each second gate conductor 53B is made of a metal piece. Other configurations of the second gate conductors 53B are the same as those of the second gate conductors 53B of the semiconductor device A13, so that the description is omitted.

The advantages of the semiconductor device A20 are described below.

As with the semiconductor device A10, the semiconductor device A20 includes the first semiconductor elements 40A each having a first electrode 41 and a second electrode 42 and bonded for electrical connection to the first conductive layer 20A, the first leads 51A connected to the first electrodes 41 and the second conductive layer 20B, the first detection conductors 52A, and the second detection conductors 52B. The first detection conductors 52A are connected to the first electrodes 41. The first gate conductors 53A are connected to the second electrodes 42. In at least either of the first detection conductors 52A and the first gate conductors 53A, the ends connected to the first semiconductor elements 40A have a coefficient of linear expansion smaller than that of the first conductive layer 20A, which assures the reliability of the semiconductor device A20.

The semiconductor device A20 is provided with an insulating layer 23 on the first conductive layer 20A. The first detection wiring layer 21A and the first gate wiring layer 22A are arranged on the insulating layer 23. Such an arrangement makes it possible to increase the area of the first conductive layer 20A as viewed along the thickness direction z and thereby to promote heat dissipation from the semiconductor device A20. Moreover, by arranging the first semiconductor elements 40A offset from the insulating layer 23 toward the second side in the first direction x, the dimension of each first lead 51A in the first direction x can be reduced. As a result, the parasitic resistance of the semiconductor device A20 can be reduced.

The semiconductor device according to the present disclosure is not limited to the foregoing embodiments. The specific configuration of each part of the semiconductor device may be varied in design in many ways.

The invention claimed is:

1. A semiconductor device comprising:
   an insulating support member having a front surface;
   a first conductive layer and a second conductive layer disposed on the front surface;
   a first semiconductor element having a first side facing the front surface and a second side facing away from the first side in a thickness direction of the insulating support member, the first semiconductor element being provided with a first electrode and a second electrode on the second side and a third electrode on the first side, the third electrode being bonded for electrical connection to the first conductive layer;
   a first lead connected to the first electrode and the second conductive layer;

a first detection conductor connected to the first electrode; and a first gate conductor connected to the second electrode, wherein each of the first detection conductor and the first gate conductor has an end connected to the first semiconductor element, at least one of the ends of the first detection conductor and the first gate conductor having a coefficient of linear expansion smaller than a coefficient of linear expansion of the first conductive layer, at least one of the first detection conductor and the first gate conductor has a pillow part connected to the first semiconductor element and a wire connected to the pillow part, the pillow part has a coefficient of linear expansion smaller than the coefficient of linear expansion of the first conductive layer, the first detection conductor comprises a metal piece, the first gate conductor comprises a pillow part connected to the first semiconductor element and a wire connected to the pillow part, and each of the first detection conductor and the pillow part has a coefficient of linear expansion smaller than the coefficient of linear expansion of the first conductive layer.

2. The semiconductor device according to claim 1, wherein the pillow part comprises: a first layer made of an alloy containing iron and nickel; and a pair of second layers made of a metal different from the first layer, and the first layer is disposed between the paired second layers in the thickness direction.

3. The semiconductor device according to claim 1, wherein the pillow part comprises a first layer made of a semiconductor material and a pair of second layers made of a metal, and the first layer is disposed between the paired second layers in the thickness direction.

4. The semiconductor device according to claim 1, wherein the first detection conductor comprises: a first layer made of an alloy containing iron and nickel; and a pair of second layers made of a metal different from the first layer, and the first layer is disposed between the paired second layers in the thickness direction.

5. The semiconductor device according to claim 1, wherein each of the first detection conductor and the first gate conductor comprises a metal piece, and each of the first detection conductor and the first gate conductor has a coefficient of linear expansion smaller than the coefficient of linear expansion of the first conductive layer.

6. The semiconductor device according to claim 1, further comprising a first detection wiring layer to which the first detection conductor is connected and a first gate wiring layer to which the first gate conductor is connected, wherein the first detection wiring layer and the first gate wiring layer overlap with the front surface as viewed along the thickness direction.

7. The semiconductor device according to claim 6, wherein the first detection wiring layer and the first gate wiring layer are disposed on the front surface.

8. The semiconductor device according to claim 6, further comprising an insulating layer disposed on the first conductive layer, wherein the first detection wiring layer and the first gate wiring layer are disposed on the insulating layer.

9. The semiconductor device according to claim 1, wherein the first semiconductor element is formed of a semiconductor material mainly composed of silicon carbide (SiC).

10. The semiconductor device according to claim 1, wherein the first lead is composed of a metal piece made of copper or copper alloy.

11. A semiconductor device comprising:

an insulating support member having a front surface;

a first conductive layer and a second conductive layer disposed on the front surface;

a first semiconductor element having a first side facing the front surface and a second side facing away from the first side in a thickness direction of the insulating support member, the first semiconductor element being provided with a first electrode and a second electrode on the second side and a third electrode on the first side, the third electrode being bonded for electrical connection to the first conductive layer;

a first lead connected to the first electrode and the second conductive layer;

a first detection conductor connected to the first electrode; and a first gate conductor connected to the second electrode, a second semiconductor element provided with a first electrode, a second electrode and a third electrode, the third electrode being bonded for electrical connection to the second conductive layer;

a second lead connected to the first electrode of the second semiconductor element;

a second detection conductor connected to the first electrode of the second semiconductor element; and a second gate conductor connected to the second electrode of the second semiconductor element, wherein each of the first detection conductor and the first gate conductor has an end connected to the first semiconductor element, at least one of the ends of the first detection conductor and the first gate conductor having a coefficient of linear expansion smaller than a coefficient of linear expansion of the first conductive layer, each of the second detection conductor and the second gate conductor has an end connected to the second semiconductor element, at least one of the ends of the second detection conductor and the second gate conductor having a coefficient of linear expansion smaller than a coefficient of linear expansion of the second conductive layer, the second detection conductor comprises a metal piece, the second gate conductor comprises a pillow part connected to the second semiconductor element and a wire connected to the pillow part, and each of the second detection conductor and the pillow part has a coefficient of linear expansion smaller than the coefficient of linear expansion of the second conductive layer.

12. The semiconductor device according to claim 11, wherein the second detection conductor comprises a pillow part connected to the second semiconductor element.

13. The semiconductor device according to claim 12, further comprising:

a second detection wiring layer to which the second detection conductor is connected; and a second gate wiring layer to which the second gate conductor is connected, wherein the second detection wiring layer and the second gate wiring layer overlap with the front surface as viewed along the thickness direction.

14. The semiconductor device according to claim 11, wherein each of the second detection conductor and the second gate conductor comprises a metal piece, and each of the second detection conductor and the second gate conductor has a coefficient of linear expansion smaller than the coefficient of linear expansion of the second conductive layer.

15. The semiconductor device according to claim 11, further comprising:

a first input terminal electrically connected to the first conductive layer;

a second input terminal electrically connected to the second lead; and an output terminal electrically connected to the second conductive layer, wherein each of the first input terminal and the second input terminal is spaced apart from the output terminal in a direction orthogonal to the thickness direction, and the second lead is connected to the second input terminal.

16. The semiconductor device according to claim 15, wherein the first input terminal and the second input terminal are spaced apart from each other in the thickness direction, and a part of the second input terminal overlaps with the first input terminal as viewed along the thickness direction.

* * * * *